(12) United States Patent
Chen et al.

(10) Patent No.: US 11,574,900 B2
(45) Date of Patent: Feb. 7, 2023

(54) INTEGRATED CIRCUIT DEVICE AND METHOD

(71) Applicant: TAIWAN SEMICONDUCTOR MANUFACTURING CO., LTD., Hsinchu (TW)

(72) Inventors: Chih-Liang Chen, Hsinchu (TW); Shun Li Chen, Tainan (TW); Li-Chun Tien, Tainan (TW); Ting Yu Chen, Hsinchu (TW); Hui-Zhong Zhuang, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 136 days.

(21) Appl. No.: 16/910,658

(22) Filed: Jun. 24, 2020

(65) Prior Publication Data

US 2021/0407985 A1    Dec. 30, 2021

(51) Int. Cl.
*H01L 27/02* (2006.01)
*G06F 30/392* (2020.01)
*H01L 27/092* (2006.01)

(52) U.S. Cl.
CPC ........ *H01L 27/0207* (2013.01); *G06F 30/392* (2020.01); *H01L 27/092* (2013.01)

(58) Field of Classification Search
CPC .. H01L 27/0207; H01L 27/092; G06F 30/392
USPC ........................................................ 257/368
See application file for complete search history.

(56) References Cited

U.S. PATENT DOCUMENTS

| | | | |
|---|---|---|---|
| 7,260,442 B2 | 8/2007 | Hwang et al. | |
| 9,256,709 B2 | 2/2016 | Yu et al. | |
| 2014/0040838 A1 | 2/2014 | Liu et al. | |
| 2015/0278429 A1 | 10/2015 | Chang | |
| 2016/0307882 A1* | 10/2016 | Chen | H01L 27/1104 |

* cited by examiner

*Primary Examiner* — Tu-Tu V Ho
(74) *Attorney, Agent, or Firm* — Hauptman Ham, LLP

(57) ABSTRACT

A method includes generating a layout diagram of a cell of an integrated circuit (IC), and storing the generated layout diagram on a non-transitory computer-readable medium. In the generating the layout diagram of the cell, a first active region is arranged inside a boundary of the cell. The first active region extends along a first direction. At least one gate region is arranged inside the boundary. The at least one gate region extends across the first active region along a second direction transverse to the first direction. A first conductive region is arranged to overlap the first active region and a first edge of the boundary. The first conductive region is configured to form an electrical connection to the first active region.

20 Claims, 17 Drawing Sheets

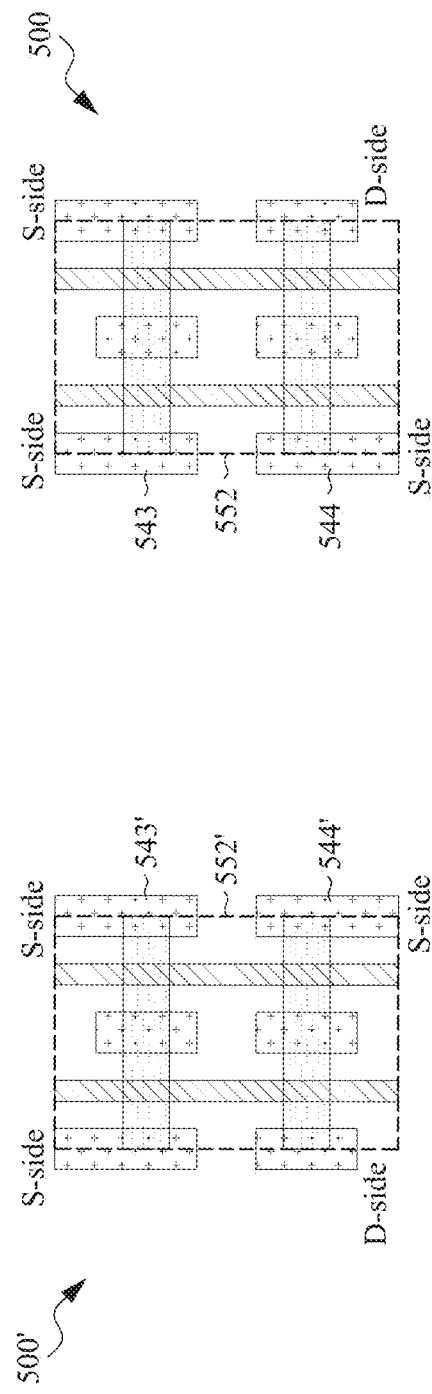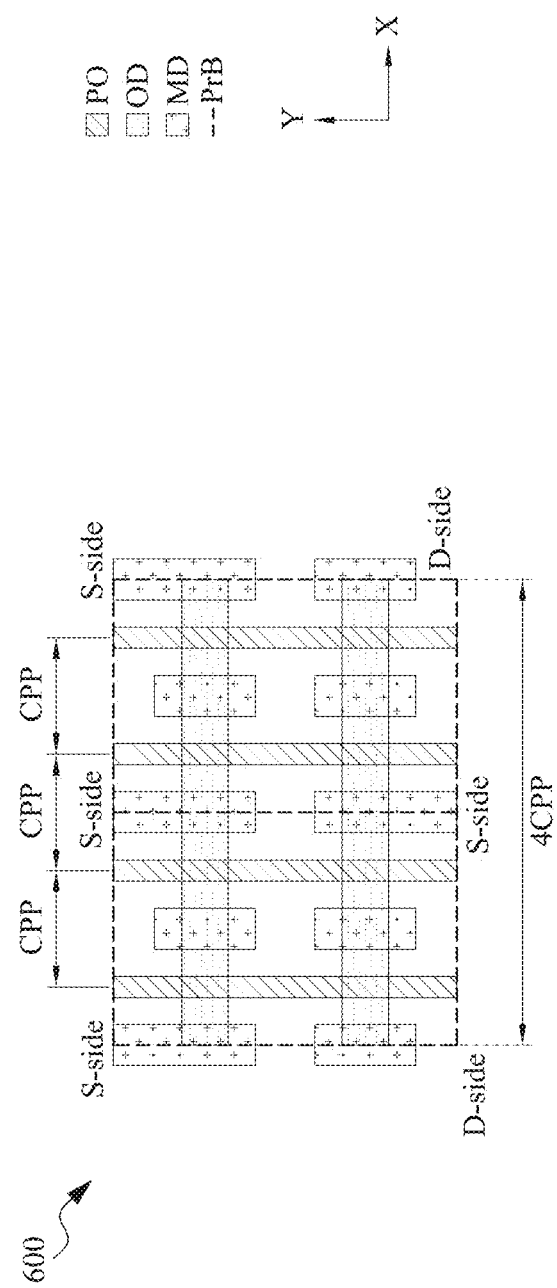
Fig. 6

1000B

1030 — placing a first cell in abutment with a second cell in an IC layout diagram, wherein a boundary of the first cell abuts a boundary of the second cell along a first common edge, and a first conductive region (MD) of the first cell is merged with a second conductive region (MD) of the second cell into a first common conductive region overlapping the first common edge 1035 — placing a third cell in abutment with the second cell in the IC layout diagram, wherein a boundary of the third cell abuts the boundary of the second cell along a second common edge, and a third conductive region (MD) of the third cell is merged with a fourth conductive region (MD) of the second cell into a second common conductive region overlapping the second common edge 1040 — storing the generated IC layout diagram on a non-transitory computer-readable medium 1045 — fabricating, based on the generated IC layout diagram, at least one of a semiconductor mask or a component in a layer of an IC

Fig. 10B

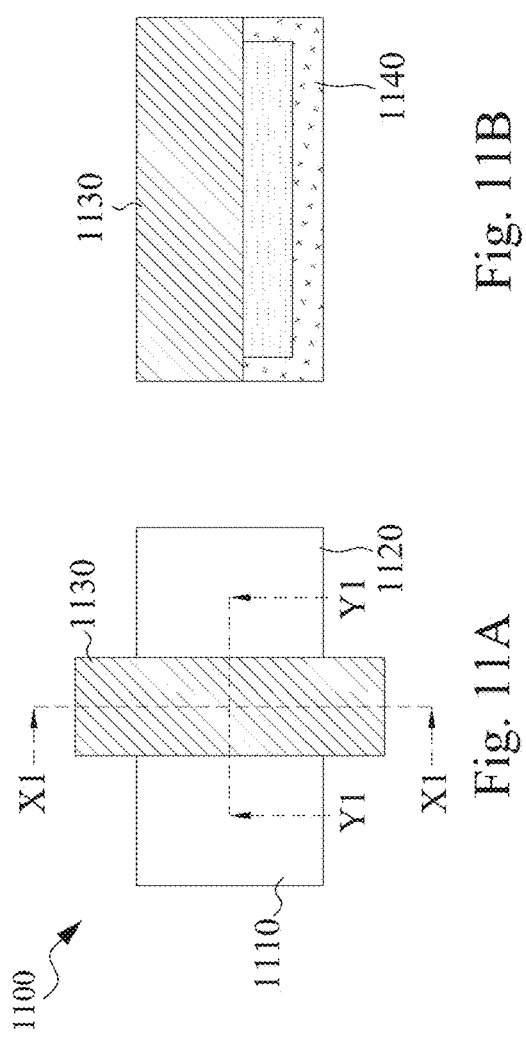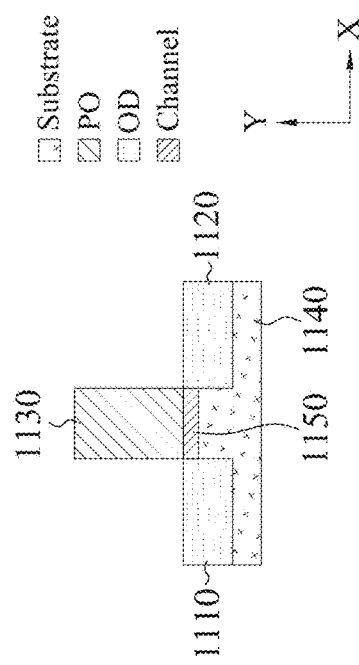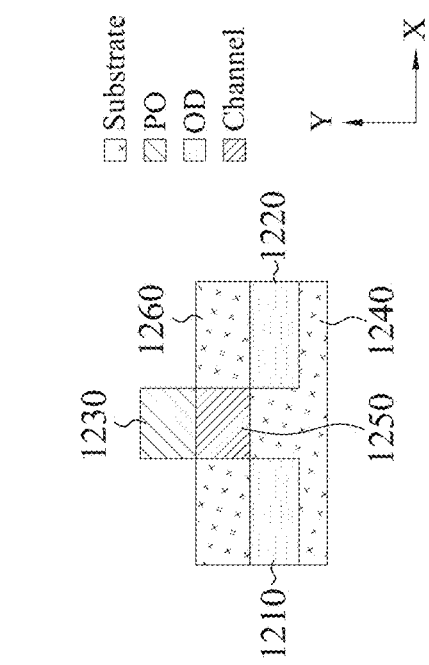
Fig. 11A  Fig. 11B  Fig. 11C
Fig. 12A  Fig. 12B  Fig. 12C

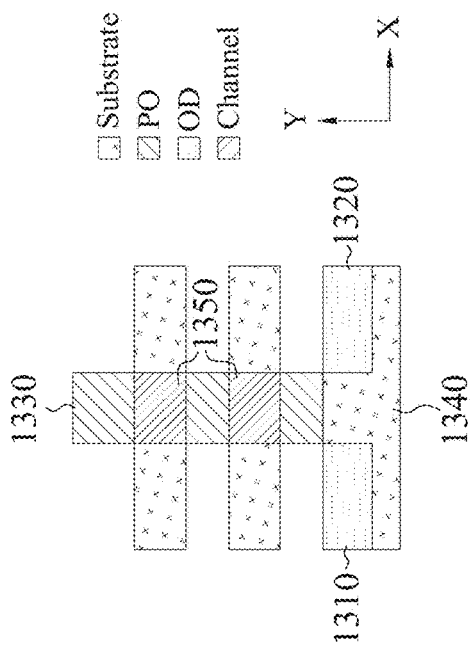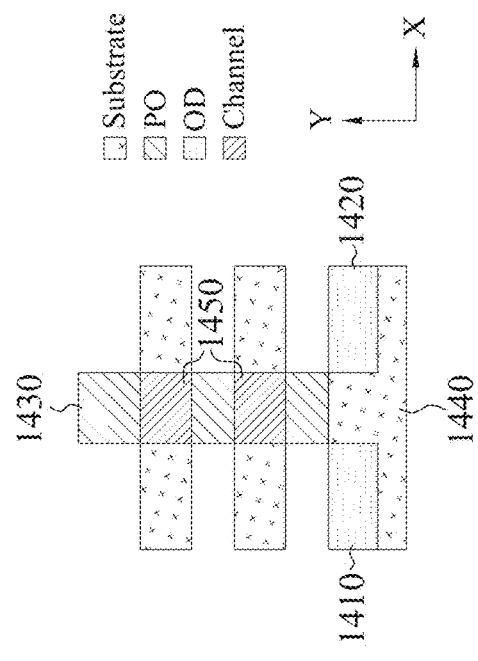
Fig. 13A  Fig. 13B  Fig. 13C
Fig. 14A  Fig. 14B  Fig. 14C

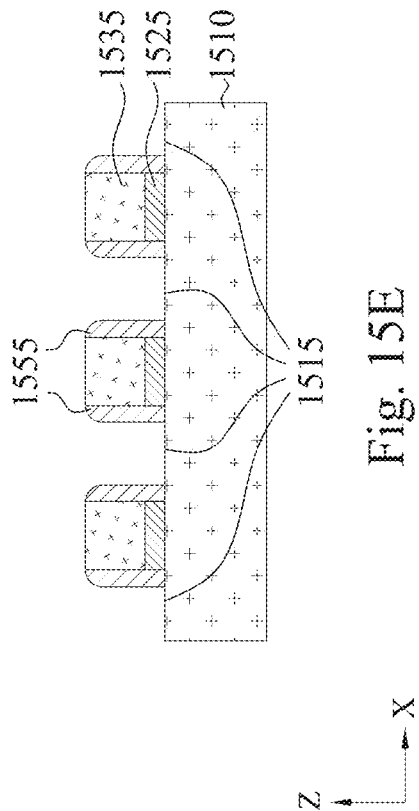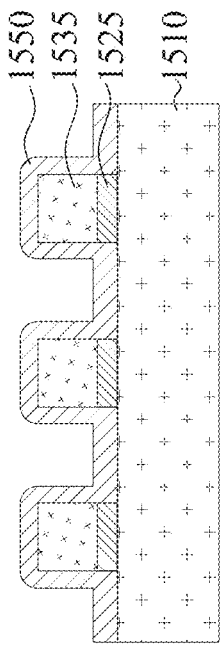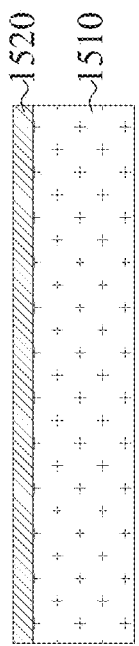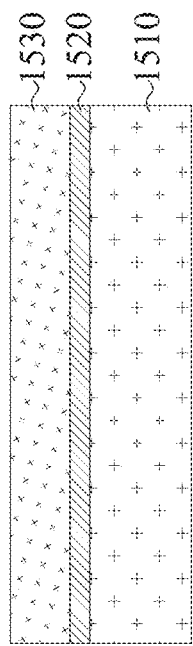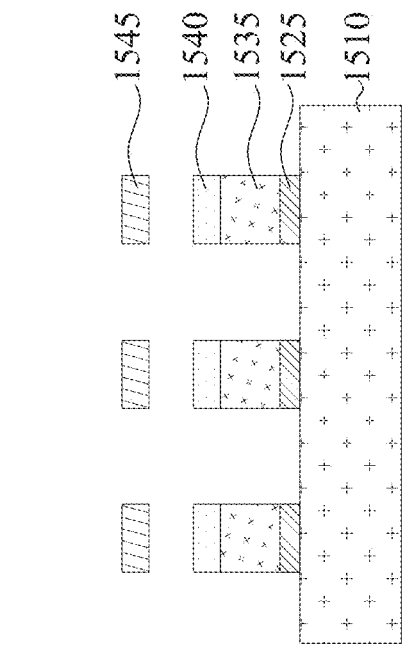

INTEGRATED CIRCUIT DEVICE AND METHOD

BACKGROUND

An integrated circuit (IC) typically includes a number of semiconductor devices represented in an IC layout diagram. An IC layout diagram is hierarchical and includes modules which carry out higher-level functions in accordance with the semiconductor device's design specifications. The modules are often built from a combination of cells, each of which represents one or more semiconductor structures configured to perform a specific function. Cells having pre-designed layout diagrams, sometimes known as standard cells, are stored in standard cell libraries (hereinafter "libraries" or "cell libraries" for simplicity) and accessible by various tools, such as electronic design automation (EDA) tools, to generate, optimize and verify designs for ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 includes an IC layout diagram of an IC device, and layout diagrams of various cells constituting the IC layout diagram of the IC device, in accordance with some embodiments.

FIG. 10B is a flow chart of a method, in accordance with some embodiments.

FIG. 11A is a schematic top plan view of a planar transistor, FIG. 11B is a schematic cross-section view of the planar transistor along line X1-X1 in FIG. 11A, and FIG. 11C is a schematic cross-section view of the planar transistor along line Y1-Y1 in FIG. 11A, in accordance with some embodiments.

FIG. 12A is a schematic top plan view of a fin field-effect transistor (FINFET), FIG. 12B is a schematic cross-section view of the FINFET along line X2-X2 in FIG. 12A, and FIG. 12C is a schematic cross-section view of the FINFET along line Y2-Y2 in FIG. 12A, in accordance with some embodiments.

FIG. 13A is a schematic top plan view of a nanosheet FET, FIG. 13B is a schematic cross-section view of the nanosheet FET along line X3-X3 in FIG. 13A, and FIG. 13C is a schematic cross-section view of the nanosheet FET along line Y3-Y3 in FIG. 13A, in accordance with some embodiments.

FIG. 14A is a schematic top plan view of a nanowire FET, FIG. 14B is a schematic cross-section view of the nanowire FET along line X4-X4 in FIG. 14A, and FIG. 14C is a schematic cross-section view of the nanowire FET along line Y4-Y4 in FIG. 14A, in accordance with some embodiments.

FIGS. 15A-15G are schematic cross-sectional views of an IC device being manufactured at various stages of a manufacturing process, in accordance with some embodiments.

DETAILED DESCRIPTION

Figure 1:
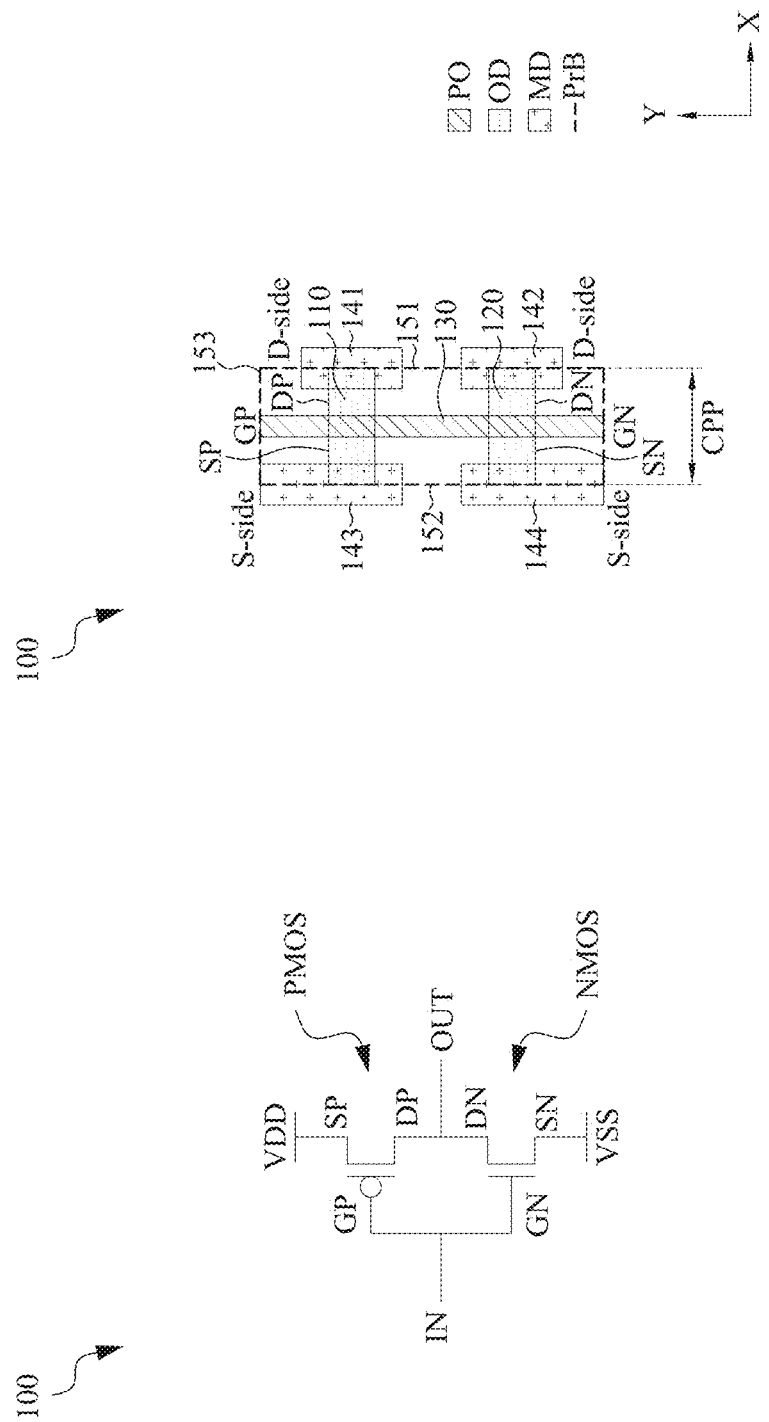
FIG. 1A is a circuit diagram and FIG. 1B is a layout diagram of a cell, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A cell has a conductive region (also referred to as "MD region" described herein) for making electrical contact with an active region of the cell. In some embodiments, cells have MD regions on edges of the boundaries of the cells. When two cells are placed in abutment with each other, the edges with the MD regions thereon abut each other. This is different from other approaches in which cells abut each other along edges with dummy gate regions thereon. Compared to the other approaches, it is possible in at least one embodiment to achieve one or more advantages including, but not limited to, reduced cell width, increased gate density, or the like.

FIG. 1A is a circuit diagram and FIG. 1B is a layout diagram of a cell 100, in accordance with some embodiments. In FIGS. 1A-1B, the cell 100 is an inverter, e.g., INVD1 (inverter with a driving strength of 1). This is an example, and other cells are within the scope of various embodiments. For example, in various embodiments, the cell 100 is a function cell, an engineering change order (ECO) cell, a filler cell, a physical cell, or another type of cell or combination of cells capable of being defined in an IC layout diagram.

A function cell is a cell pre-designed to provide a specific function to an IC incorporating such a function cell. Examples of function cells include, but are not limited to, a logic gate cell, a memory cell, or the like. Examples of logic gate cells include, but are not limited to, AND, OR, NAND, NOR, XOR, INV, AND-OR-Invert (AOI), OR-AND-Invert (OAI), MUX, Flip-flop, BUFF, Latch, delay, clock, or the like. Examples of memory cells include, but are not limited to, a static random access memory (SRAM), a dynamic RAM (DRAM), a resistive RAM (RRAM), a magnetoresistive RAM (MRAM), a read only memory (ROM) cell, or another type of cell capable of having multiple states representative of logical values.

An ECO cell is a cell pre-designed without a specific function, but is programmable to provide an intended function. For example, to design an IC, the pre-designed layouts of one or more function cells are read out from a standard cell library and placed into an initial IC layout. The IC layout also includes one or more ECO cells which are not yet connected or routed to the function cells. When the IC layout is to be revised, one or more of the already placed ECO cells are programed to provide an intended function and routed to the function cells. The programing of ECO cells involves modifications in one or more layers of the IC layout and/or masks for manufacturing the IC.

A filler cell is a cell with no logical functionality, and is not connected or routed to other cells in an IC layout diagram. A purpose of filler cells is to fill an empty space in an IC layout diagram, for example, to satisfy one or more design rules, such as minimum spacing between adjacent features. Cells other than filler cells are referred to herein as "non-filler cells."

A physical cell is a cell configured to provide a function, other than a logic function, to an IC incorporating such physical cell. Examples of physical cells include, but are not limited to, a TAP cell, a DCAP cell, or the like. A TAP cell defines a region in a doped well where the doped well is coupled to a bias voltage, such as a power supply voltage. TAP cells are included in an IC layout diagram, e.g., to improve latch-up immunity of ICs manufactured in accordance with the IC layout diagram. A DCAP cell includes one or more decoupling capacitors (decap) between power buses or rails, e.g., as a charge reservoir to provide additional power in situations where there is a high demand for current from the power supply.

In the example circuit diagram in FIG. 1A, the inverter in the cell 100 comprises a p-channel metal-oxide semiconductor (PMOS) transistor and an n-channel metal-oxide semiconductor (NMOS) transistor coupled in series between a first power supply voltage VDD and a second power supply voltage VSS. Specifically, the PMOS transistor comprises a gate region GP, a source region SP, and a drain region DP. The NMOS transistor comprises a gate region GN, a source region SN, and a drain region DN. The gate regions GP, GN are coupled to an input node IN. The drain regions DP, DN are coupled to an output node OUT. The source region SP is coupled to VDD, and the source region SN is coupled to VSS. In at least one embodiment, VDD is a positive power supply voltage, and VSS is a ground voltage. The inverter is configured to invert a signal at the input node IN and to output the inverted signal at the output node OUT.

In the example layout diagram in FIG. 1B, the cell 100 comprises a first active region 110, a second active region 120, a gate region 130, conductive regions 141, 142, 143, 144, and a boundary 150. In at least one embodiment, the layout diagram of the cell 100, as well as the layout diagrams of other cells in accordance with various embodiments, are stored in a standard cell library on a non-transitory computer-readable medium.

The first active region 110 and the second active region 120 are arranged inside the boundary 150, and extend along a first direction, i.e., X direction. Active regions are sometimes referred to as oxide-definition (OD) regions, and are schematically illustrated in the drawings with the label "OD." The X direction is sometimes referred to as the OD direction. The first active region 110 and the second active region 120 include P-type dopants and/or N-type dopants to form one or more circuit elements or devices. Examples of circuit elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, P-channel and/or N-channel field effect transistors (PFETs/NFETs), etc.), FinFETs, planar MOS transistors with raised source/drains, nanosheet FETs, nanowire FETs, or the like. An active region configured to form one or more PMOS devices therein is referred to herein as "PMOS active region," and an active region configured to form one or more NMOS devices therein is referred to herein as "NMOS active region." For example, the first active region 110 is a PMOS active region configured to form, together with the gate region 130, the PMOS transistor of the inverter as described with respect to FIG. 1A. The second active region 120 is an NMOS active region configured to form, together with the gate region 130, the NMOS transistor of the inverter as described with respect to FIG. 1A. Specifically, the PMOS active region 110 comprises the drain region DP and the source region SP on opposite sides of a section of the gate region 130 which extends over the PMOS active region 110 and defines the gate region GP. The NMOS active region 120 comprises the drain region DN and the source region SN on opposite sides of another section of the gate region 130 which extends over the NMOS active region 120 and defines the gate region GN. In the example configuration in FIG. 1B, each of the PMOS active region 110 and NMOS active region 120 has, in the X direction, opposite edges (not numbered) coinciding with edges 151, 152 of the boundary 150 which are opposite each other in the X direction. Other configurations are within the scope of various embodiments. The cell 100 comprises two active regions 110, 120 in the Y direction. This is an example, and other cells in various embodiments include other numbers of active regions in the Y direction.

The gate region 130 is arranged inside the boundary 150, and extends across the PMOS active region 110 and the NMOS active region 120 along a second direction, i.e., Y direction, which is transverse to the X direction. The gate region 130 includes a conductive material, such as, polysilicon, and is schematically illustrated in the drawings with the label "PO." The Y direction is sometimes referred to as the Poly direction. Other conductive materials for the gate region, such as metals, are within the scope of various embodiments. The cell 100 comprises a single gate region. This is an example, and other cells in various embodiments include more than one gate regions. In the example configuration in FIG. 1B, the gate region 130 has, in the Y direction, opposite edges (not numbered) coinciding with edges 153, 154 of the boundary 150 which are opposite each other in the Y direction. Other configurations are within the scope of various embodiments.

The conductive regions 141, 143 overlap and are configured to form electrical connections to the PMOS active region 110, whereas the conductive regions 142, 144 overlap and are configured to form electrical connections to the NMOS active region 120. The conductive regions 141, 142, 143, 144 are referred to herein as "MD regions," i.e., metal-zero-over-oxide regions, and are schematically illustrated in the drawings with the label "MD." An MD region includes a conductive material formed over a corresponding active region to define an electrical connection from one or more devices formed in the active region to other internal circuitry of the IC or to outside circuitry. In at least one embodiment, the MD regions 141, 142, 143, 144 are formed of metal and belong to a first metal layer of an IC, referred to herein as "MO layer," i.e., metal-zero (MO) layer, which is the lowermost metal layer immediately over the active regions. MD regions are arranged alternatively with gate regions in the X direction. In some embodiments, a pitch between adjacent MD regions in the X direction, i.e., a distance in the X direction between center lines of the adjacent MD regions, is equal to a pitch CPP between adjacent gate regions in the X direction, for example, as described with respect to FIG. 3. In at least one embodiment, for an x number of gate regions formed over an active region, there are (x+1) MD regions formed over the active region. For example, in FIG. 1B, for one gate region 130, i.e., the gate region GP, formed over the PMOS active region 110, there are two MD regions 141, 143 formed over the same PMOS active region 110 on opposite sides of the gate region 130. Likewise, for one gate region 130, i.e., the gate region GN, formed over the NMOS active region 120, there are two MD regions 142, 144 formed over the same NMOS active region 120 on opposite sides of the gate region 130. An MD region that overlaps a drain region in an active region and is configured to form an electrical connection to the drain region is referred to herein as "drain side MD region" or "drain side conductive region," and is schematically indicated in the drawings with the label "D-side." For example, the MD region 141 and the MD region 142 are drain side MD regions which overlap and form electrical connections to the drain regions DP, DN, respectively. An MD region that overlaps a source region in an active region and is configured to form an electrical connection to the source region is referred to herein as "source side MD region" or "source side conductive region," and is schematically indicated in the drawings with the label "S-side." For example, the MD region 143 and the MD region 144 are source side MD regions which overlap and form electrical connections to the source regions SP, SN, respectively. One or more via layers and/or metal layers (not shown) are configured over the MD regions 141, 142, 143, 144 and the gate region 130 to form interconnections inside the cell 100 and/or to other cells, e.g., to electrically couple the source side MD region 143 to VDD, the source side MD region 144 to VSS, the drain side MD regions 141, 142 to a node corresponding to output node OUT in FIG. 1A, and the gate region 130 to a further node corresponding to output node OUT in FIG. 1A. In at least one embodiment, the MD regions 141, 142, 143, 144 have the same width in the X direction, and the source side MD regions 143, 144 have a greater length in the Y direction than the drain side MD regions 141, 142. Other configurations are within the scope of various embodiments.

The boundary 150 comprises the edges 151, 152, 153, 154 connected together to form a closed boundary of the cell 100. In a place-and-route operation (also referred to as "automated placement and routing (APR)") described herein, cells are placed in an IC layout diagram in abutment with each other at their respective boundaries. For example, the cell 100 is placed in abutment with other cells in the X direction at the edges 151, 152, as described herein. The cell 100 is further placed in abutment with other cells in the Y direction at the edges 153, 154. The boundary 150 is sometimes referred to as "place-and-route boundary" and is schematically illustrated in the drawings with the label "PrB." The rectangular shape of the boundary 150 is an example. Other boundary shapes for various cells are within the scope of various embodiments.

The MD regions 141, 142, 143, 144 are arranged along and overlap edges of the boundary 150. For example, the MD regions 141, 142 are arranged along and overlap the edge 151, and the MD regions 143, 144 are arranged along and overlap the edge 152. In at least one embodiment, the edge 151 coincides with a center line of each of the MD regions 141, 142 in the X direction. In other words, the edge 151 bisects a width of each of the MD regions 141, 142 in the X direction. In at least one embodiment, the edge 152 coincides with a center line of each of the MD regions 143, 144 in the X direction. The width of the boundary 150 is the distance between the edges 151, 152, and is equal to one pitch CPP between the adjacent MD regions (e.g., between the MD regions 141, 143, or between the MD regions 142, 144) in the X direction. In the example configuration in FIG. 1B, the cell 100 comprises two active regions 110, 120 in the Y direction, and two corresponding MD regions on each edge 151 or 152. Other configurations are within the scope of various embodiments. For example, in some embodiments where a cell comprises one, or three or four active region(s) in the Y direction, corresponding one or three or four MD region(s) is/are arranged on each edge 151 or 152. In a place-and-route operation when the cell 100 is placed to abut other cells in the X direction, the MD regions 141, 142, 143, 144 along the edges of the boundary 150 are merged with corresponding MD regions of the other cells, as described herein with respect to FIGS. 3-4, for example.

Figure 2:
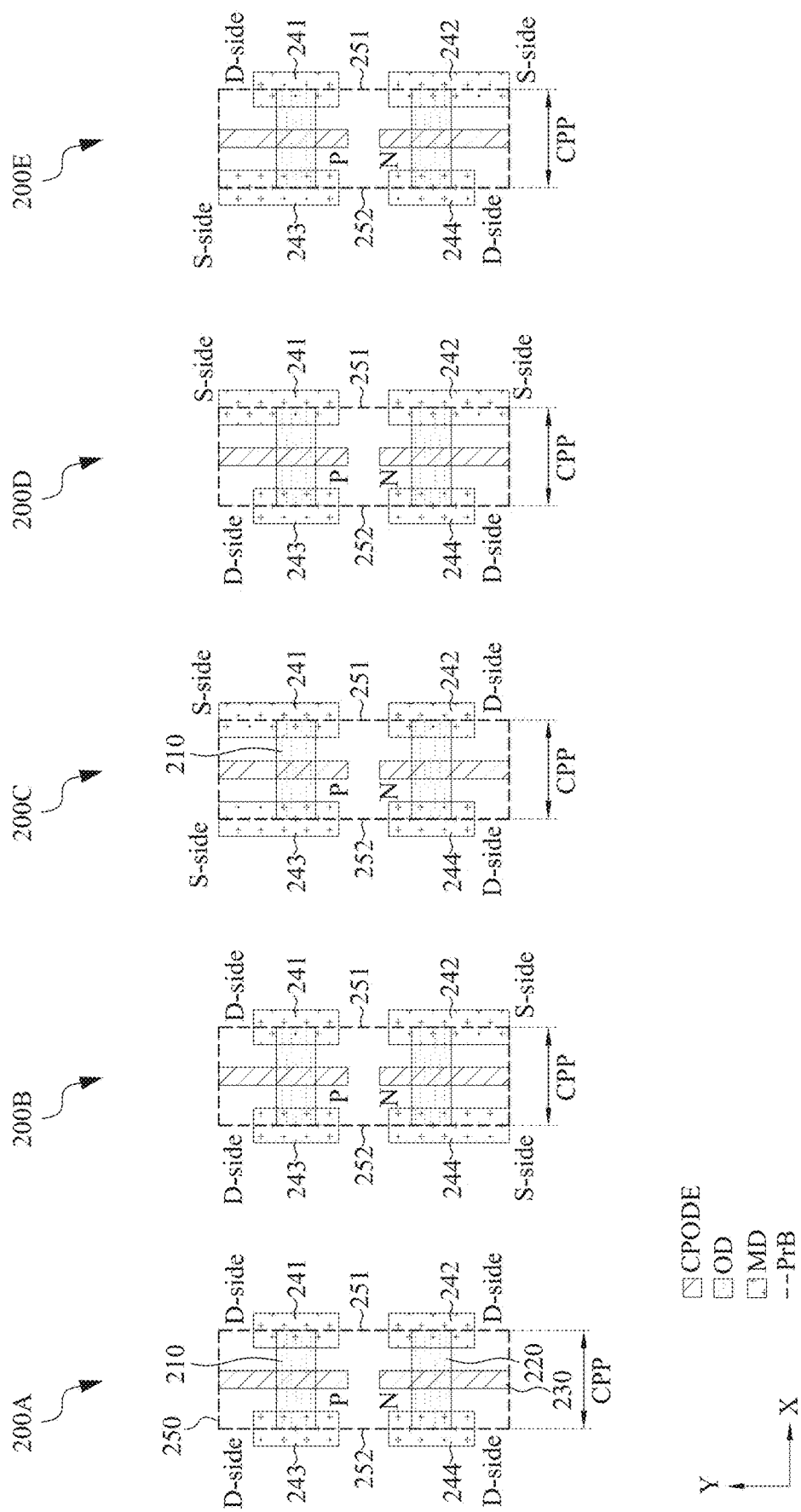
FIG. 2 includes layout diagrams of various filler cells, in accordance with some embodiments.

FIG. 2 includes layout diagrams of various filler cells 200A-200E, in accordance with some embodiments. FIG. 2 should not be construed as an exhaustive presentation of all filler cells in accordance with some embodiments. Other filler cell configurations are within the scope of various embodiments. For simplicity, similar components in filler cells 200A-200E are indicated by similar reference numerals. Further, components in FIG. 2 having corresponding components in FIG. 1B are designated by the reference numerals of FIG. 1B increased by 100. In at least one embodiment, the layout diagrams of the filler cells 200A-200E, as well as the layout diagrams of other cells in accordance with various embodiments, are stored in a standard cell library on a non-transitory computer-readable medium.

Similar to the cell 100, each of the filler cells 200A-200E comprises a PMOS active region 210, an NMOS active region 220, a gate region 230 across the active regions 210, 220, and MD regions 241-244 on a boundary 250 of the filler cell along edges 251, 252 opposite each other in the X direction. For simplicity, the reference numerals 210, 220, 230, 250 are illustrated for the filler cell 200A, and one or more of the reference numerals 210, 220, 230, 250 are omitted for the other filler cells 200B-200E. Each of the filler cells 200A-200E also has a width of one pitch CPP in the X direction.

A difference between the filler cells 200A-200E and the cell 100 is that the gate region 230 in each of the filler cells 200A-200E is a dummy gate region, schematically illustrated in the drawings with the label "CPODE." For example, in the filler cell 200A, the dummy gate region 230 includes a P section over the PMOS active region 210, and an N section over the NMOS active region 220. Unlike the gate region 130 of the cell 100 which is electrically coupled by further via and/or metal layers to one or more other cells, the dummy gate region 230 is not electrically coupled to other cells. The configuration in FIG. 2 where the dummy gate region 230 includes two sections P and N separated from each other in the Y direction is an example. Other configurations are within the scope of various embodiments.

A further difference between the filler cells 200A-200E and the cell 100 is that, although an MD region in the filler cells 200A-200E is indicated in FIG. 2 as a drain side MD region by a corresponding label "D-side," the area of the active region underlying such a drain side MD region is not necessarily a drain region. For example, in the filler cell 200A, both MD regions 241, 243 are indicated as drain side MD regions. However, the areas of the active region 210 underlying the MD regions 241, 243 are not necessarily drain regions because the cell 200A is a filler cell with no logical functionality. The designation and/or configuration of the MD regions 241, 243 in the filler cell 200A as drain side MD regions is/are to match corresponding drain side MD regions of other non-filler cells to be abutted with the filler cell 200A, as described herein with respect to FIG. 4, for example. The same is applicable to other MD regions indicated in the filler cells 200A-200E by labels "D-side." Similarly, although an MD region in the filler cells 200A-200E is indicated in FIG. 2 as a source side MD region by a corresponding label "S-side," the area of the active region underlying such a source side MD region is not necessarily a source region. For example, in the filler cell 200C, both MD regions 241, 243 are indicated as source side MD regions. However, the areas of the active region 210 underlying the MD regions 241, 243 are not necessarily source regions because the cell 200C is a filler cell with no logical functionality. The designation and/or configuration of the MD regions 241, 243 in the filler cell 200C as source side MD regions is/are to match corresponding source side MD regions of other non-filler cells to be abutted with the filler cell 200C, as described herein with respect to FIG. 7, for example. The same is applicable to other MD regions indicated in the filler cells 200A-200E by labels "S-side."

The filler cells 200A-200E differ from each other in the designation and/or configuration of the MD regions 241-244 as drain side MD region(s) and/or source side MD region(s). For example, the filler cell 200A includes four drain side MD regions 241-244, the filler cell 200B includes two drain side MD regions 241, 243 and two source side MD regions 242, 244, the filler cell 200C includes two source side MD regions 241, 243 and two drain side MD regions 242, 244, the filler cell 200D includes two drain side MD regions 243, 244 and two source side MD regions 241, 242, and the filler cell 200E includes two drain side MD regions 241, 244 and two source side MD regions 242, 243. In one or more embodiments, the different configurations of the filler cells 200A-200E ensure the availability of a filler cell which is insertable, in the X direction, between any pair of non-filler cells in a place-and-route operation, despite various possible combinations of drain side MD regions and/or source side MD regions along opposing edges of the pair of non-filler cells. Several non-exhaustive examples are described with respect to FIGS. 4, 7 and 9.

Figure 3:
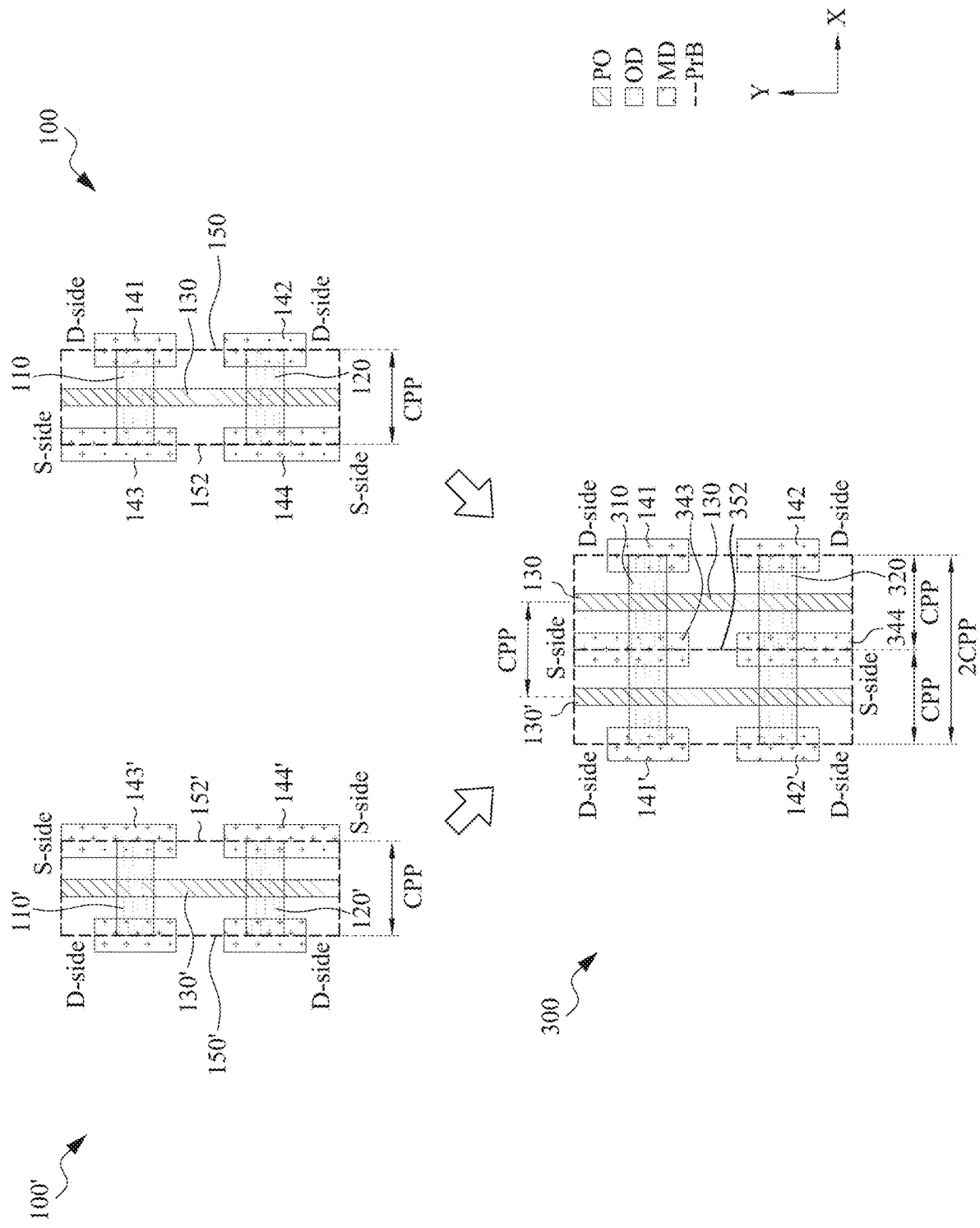
FIG. 3 includes an IC layout diagram of an IC device, and layout diagrams of various cells constituting the IC layout diagram of the IC device, in accordance with some embodiments.

FIG. 3 includes an IC layout diagram of an IC device 300, and layout diagrams of various cells constituting the IC layout diagram of the IC device 300, in accordance with some embodiments. The IC layout diagram of the IC device 300 is generated by placing a first cell in abutment with a second cell, e.g., in a place-and-route operation. For example, the first cell is the cell 100 described with respect to FIG. 1B, and the second cell is a cell 100'. The cell 100' has a layout diagram obtain by flipping the layout diagram of the cell 100 in the X direction. Like the cell 100, the cell 100' is also an inverter. Components in the cell 100' having corresponding components in the cell 100 are designated by the reference numerals of the cell 100 but with the prime symbol.

In the place-and-route operation, the cell 100 is placed to abut the cell 100'. Specifically, the edge 152 of the cell 100 with the source side MD regions 143, 144 thereon is placed to coincide with an edge 152' of the cell 100' with the source side MD regions 143', 144' thereon. As a result, a common edge 352 is obtained from the overlapping edges 152, 152'. In other words, the boundary 150 of the cell 100 is placed to abut a boundary 150' of the cell 100' along the common edge 352. In addition, the source side MD region 143 of the cell 100 is merged with the corresponding source side MD region 143' of the cell 100', resulting in a source side MD region 343 in the IC device 300. The source side MD region 144 of the cell 100 is merged with the corresponding source side MD region 144' of the cell 100', resulting in a source side MD region 344 in the IC device 300. The source side MD regions 343, 344 in the IC device 300 overlap the common edge 352. The PMOS active region 110 of the cell 100 is continuous with the PMOS active region 110' of the cell 100' at the common edge 352, resulting in a combined PMOS active region 310 of the IC device 300. The NMOS active region 120 of the cell 100 is continuous with the NMOS active region 120' of the cell 100' at the common edge 352, resulting in a combined NMOS active region 320 of the IC device 300. The IC device 300 further comprises the MD regions 141, 142 and the gate region 130 of the cell 100, as well as the MD regions 141', 142' and the gate region 130' of the cell 100'. The gate regions 130, 130' are adjacent to each other in the X direction, and arranged at a pitch CPP which is a distance between a center line of the gate region 130 and a centerline of the gate region 130'. As described herein, the pitch CPP between adjacent gate regions of the IC device 300 is the same as the pitch between adjacent MD regions. The abutted cells in the IC device 300 have a width of 2 CPP which is the sum of the widths of the cell 100 and cell 100'.

In at least one embodiment, a direct abutment of a first cell and a second cell as described with respect to FIG. 3 is performed when all MD regions along the opposing edges of the first and second cells are source side MD regions. For example, the cell 100 and cell 100' are directly abutted, because the MD regions 143, 144, 143', 144' along the opposing edges 152, 152' are all source side MD regions. A reason is that potentials or voltages to be supplied to source side MD regions in operation are known or predetermined. For example, the potential or voltage to be supplied to the source side MD regions 143, 143' is the potential or voltage to be supplied to a source region of a PMOS transistor or device, i.e., VDD as described with respect to FIG. 1A. The same VDD is to be supplied to the source side MD region 343 obtained by merging the source side MD regions 143, 143'. Similarly, the potential or voltage to be supplied to the source side MD regions 144, 144' is the potential or voltage to be supplied to a source region of an NMOS transistor or device, i.e., VSS as described with respect to FIG. 1A. The same VSS is to be supplied to the source side MD region 344 obtained by merging the source side MD regions 144, 144'. Thus, the direct abutment of the cell 100 and cell 100' is performed without affecting operation or functionality of the abutted cell 100 and cell 100' in the resulting IC device 300, in at least one embodiment.

In at least one embodiment, when at least one of the MD regions along the opposing edges of the first and second cells is a drain side MD region, an insertion of a filler cell between the first and second cells is performed. A reason is that a potential or voltage to be supplied to a drain side MD region in operation is variable. For example, a potential or voltage to be supplied to a drain side MD region is the potential or voltage to be supplied to a drain region of a PMOS or NMOS transistor or device, i.e., a variable signal, for example, at an output node OUT described with respect to FIG. 1A. In some situations, a direct abutment of two cells along an edge with a drain side MD region involves a risk that another MD region with a different voltage or potential is merged with the drain side MD region, resulting in potentially incorrect operation of the directly abutted cells. The insertion of a filler cell is to reduce such a risk.

Figure 4:
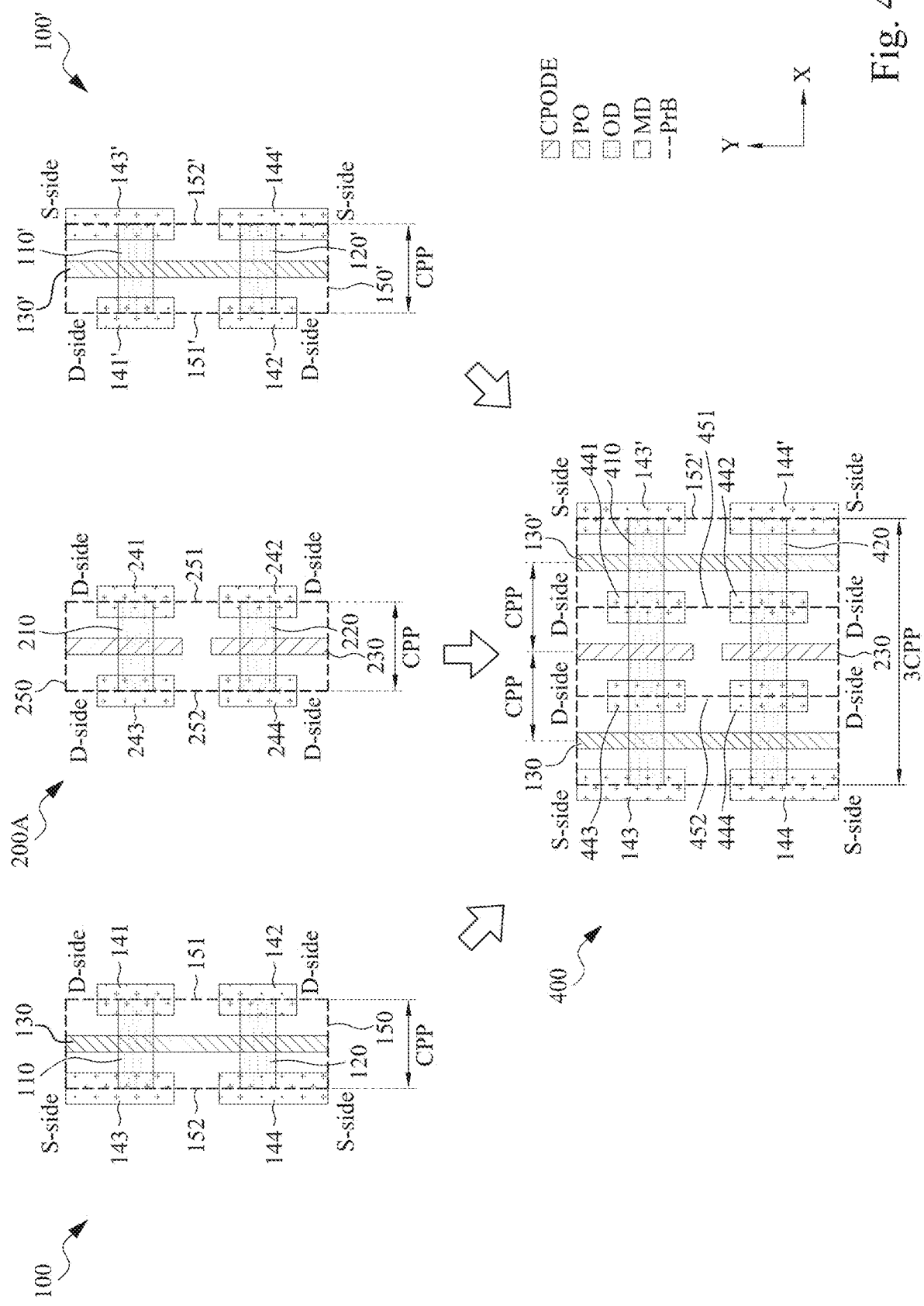
FIG. 4 includes an IC layout diagram of an IC device, and layout diagrams of various cells constituting the IC layout diagram of the IC device, in accordance with some embodiments.

FIG. 4 includes an IC layout diagram of an IC device 400, and layout diagrams of various cells constituting the IC layout diagram of the IC device 400, in accordance with some embodiments. The IC layout diagram of the IC device 400 is generated by placing a filler cell between and in abutment with two other cells, e.g., in a place-and-route operation. For example, a filler cell 200A is inserted between and placed in abutment with a cell 100 and a cell 100'.

A difference between FIG. 4 and FIG. 3 is that, in FIG. 3, the cell 100 and 100' are placed with the edges 152, 152' opposing each other, whereas, in FIG. 4, the cell 100 and 100' are placed with a different pair of edges, i.e., the edges 151, 151', opposing each other. In FIG. 3, because all MD regions 143, 144, 143', 144' along the opposing edges 152, 152' are source side MD regions, the cell 100 and cell 100' are placed in direct abutment, as described herein. However, in FIG. 4, because at least one (in fact, all) of the MD regions 141, 142, 141', 142' along the opposing edges 151, 151' is a drain side MD region, insertion of a filler cell between the cell 100 and cell 100' is performed, as also described herein.

In some embodiments, the filler cell to be inserted between the cell 100 and cell 100' in FIG. 4 is selected based on the MD regions on the opposing edges 151, 151' of the cell 100 and cell 100'. For example, when the filler cell is inserted between the cell 100 and cell 100', the filler cell has an edge 252 opposing the edge 151 of the cell 100, and an edge 251 opposing the edge 151' of the cell 100'. Because the MD regions 141, 142 on the edge 151 of the cell 100 are drain side MD regions, the filler cell is selected such that the MD regions 243, 244 on the opposing edge 252 are also drain side MD regions. Because the MD regions 141', 142' on the edge 151' of the cell 100' are drain side MD regions, the filler cell is selected such that the MD regions 241, 242 on the opposing edge 251 are also drain side MD regions. As a result, the filler cell to be inserted between the cell 100 and 100' in FIG. 4 is selected to have four drain side MD regions 241, 242, 243, 244 along the edges 251, 252. Among the filler cells, e.g., the filler cells 200A-200E, stored in the standard cell library, the filler cell 200A meets these criteria and is selected to be inserted between the cell 100 and cell 100'. In some embodiments, at least one of the described determination of whether a filler cell is to be inserted between two other cells or the described selection of the filler cell to be inserted is performed by a processor in a place-and-route operation.

The abutment between the filler cell 200A and the cell 100, and the abutment between the filler cell 200A and the cell 100' in FIG. 4 are similar to the abutment between the cell 100 and cell 100' in FIG. 3. For example, the edge 151 of the cell 100 is placed to coincide with the opposing edge 252 of the filler cell 200A, resulting in a common edge 452. The drain side MD regions 141, 142 of the cell 100 are merged with the corresponding drain side MD regions 243, 244 of the filler cell 200A, resulting in drain side MD regions 443, 444, respectfully, which overlap the common edge 452. The edge 151' of the cell 100' is placed to coincide with the opposing edge 251 of the filler cell 200A, resulting in a common edge 451. The drain side MD regions 141', 142' of the cell 100' are merged with the corresponding drain side MD regions 241, 242 of the filler cell 200A, resulting in drain side MD regions 441, 442, respectfully, which overlap the common edge 451. The PMOS active region 110 of the cell 100, the PMOS active region 210 of the filler cell 200A, and the PMOS active region 110' of the cell 100' become continuous at the common edges 452, 451, resulting in a combined PMOS active region 410 of the IC device 400. The NMOS active region 120 of the cell 100, the NMOS active region 220 of the filler cell 200A, and the NMOS active region 120' of the cell 100' become continuous at the common edges 452, 451, resulting in a combined NMOS active region 420 of the IC device 400. The IC device 400 further comprises the MD regions 143, 144 and the gate region 130 of the cell 100, the dummy gate region 230 of the filler cell 200A, as well as the MD regions 143', 144' and the gate region 130' of the cell 100'. The gate regions 130, 130' are on opposite sides of the dummy gate region 230, and are arranged at the pitch CPP which is the same as the pitch between adjacent MD regions in the IC device 400. The abutted cells in the IC device 400 have a width of 3 CPP which is the sum of the widths of the cell 100, filler cell 200A and cell 100'.

Figure 5:
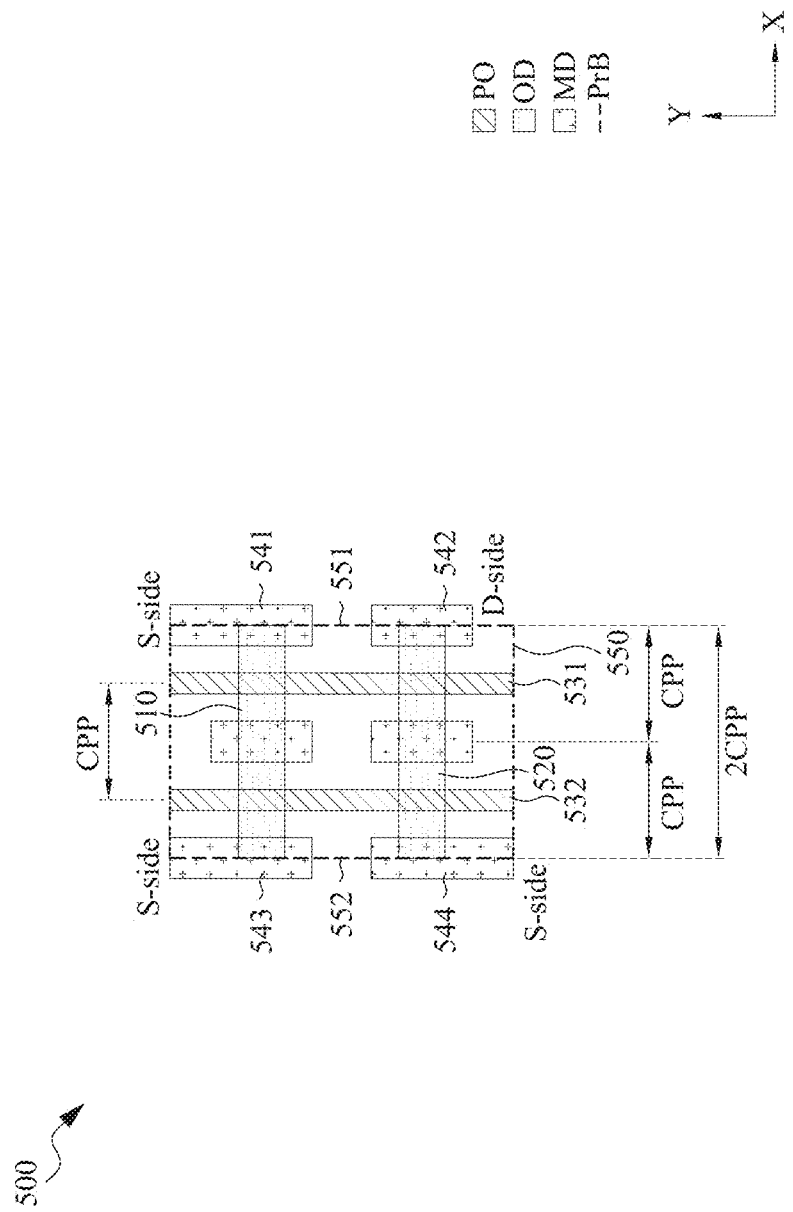
FIG. 5 is a layout diagram of a cell, in accordance with some embodiments.

FIG. 5 is a layout diagram of a cell 500, in accordance with some embodiments. The cell 500 is a NAND gate, e.g., ND2D1 (2-input NAND gate with a driving strength of 1). This is another example of cells within the scope of various embodiments. Components in FIG. 5 having corresponding components in FIG. 1B are designated by the reference numerals of FIG. 1B increased by 400. In particular, the cell 500 comprises a first active region 510, a second active region 520, gate regions 531, 532 corresponding to the gate region 130, and conductive regions 541, 542, 543, 544, on a boundary 550 along edges 551, 552. The conductive regions 541, 543, 544 are source side MD regions, and the conductive region 542 is a drain side MD region. The cell 500 further comprises various MD regions (not numbered) between the gate regions 531, 532, and crossing the first active region 510, and second active region 520. In at least one embodiment, the layout diagram of the cell 500, as well as the layout diagrams of other cells in accordance with various embodiments, are stored in a standard cell library on a non-transitory computer-readable medium.

FIG. 6 includes an IC layout diagram of an IC device 600, and layout diagrams of various cells constituting the IC layout diagram of the IC device 600, in accordance with some embodiments. The IC layout diagram of the IC device 600 is generated by placing a first cell in abutment with a second cell, e.g., in a place-and-route operation. For example, the first cell is the cell 500 described with respect to FIG. 5, and the second cell is a cell 500' which has a layout diagram obtain by flipping the layout diagram of the cell 500 in the X direction. Like the cell 500, the cell 500' is also a NAND gate. Components in the cell 500' having corresponding components in the cell 500 are designated by the reference numerals of the cell 500 but with the prime symbol. The IC device 600 in FIG. 6 is generated by a direct abutment of the cell 500 and the cell 500' at the edges 552, 552' along which all MD regions 543, 544, 543', 544' are source side MD regions. The direct abutment of the cell 500 and the cell 500' is similar to the direct abutment of the cell 100 and the cell 100' described with respect to FIG. 3.

Figure 7:
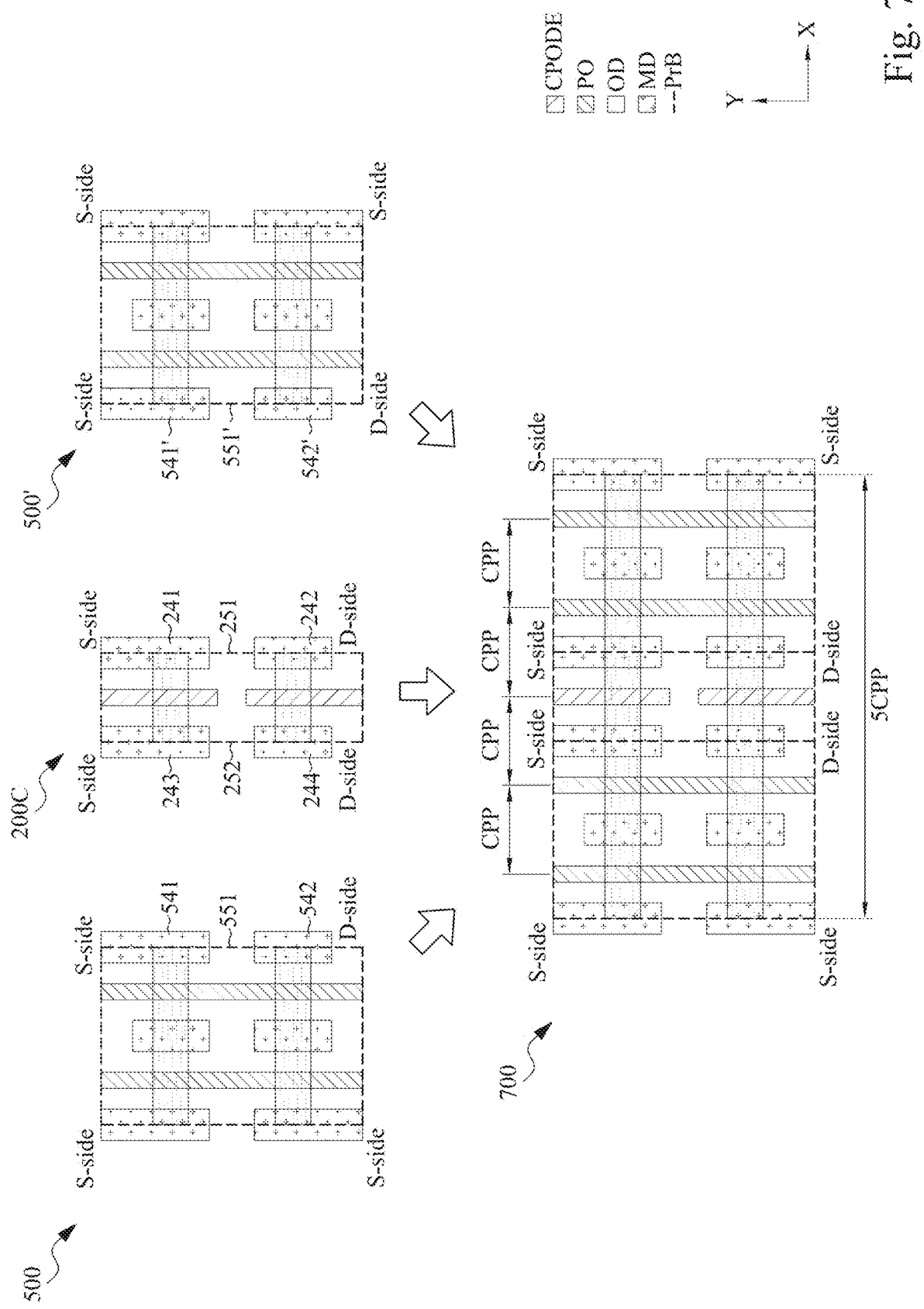
FIG. 7 includes an IC layout diagram of an IC device, and layout diagrams of various cells constituting the IC layout diagram of the IC device, in accordance with some embodiments.

FIG. 7 includes an IC layout diagram of an IC device 700, and layout diagrams of various cells constituting the IC layout diagram of the IC device 700, in accordance with some embodiments. The IC layout diagram of the IC device 700 is generated by placing a filler cell between and in abutment with two other cells, e.g., in a place-and-route operation. For example, a filler cell 200C is inserted between and placed in abutment with a cell 500 and a cell 500'.

A difference between FIG. 7 and FIG. 6 is that, in FIG. 6, the cell 500 and 500' are placed with the edges 552, 552' opposing each other, whereas, in FIG. 7, the cell 500 and 500' are placed with a different pair of edges, i.e., the edges 551, 551', opposing each other. In FIG. 6, because all MD regions 543, 544, 543', 544' along the opposing edges 552, 552' are source side MD regions, the cell 500 and cell 500' are placed in direct abutment. However, in FIG. 7, because at least one of the MD regions (i.e., 542, 542') along the opposing edges 551, 551' is a drain side MD region, insertion of a filler cell between the cell 500 and cell 500' is performed. In some embodiments, the filler cell 200C to be inserted between the cell 500 and cell 500' in FIG. 7 is selected in a manner similar to FIG. 4. The abutment between the filler cell 200C and the cell 500, and the abutment between the filler cell 200C and the cell 500' in FIG. 7 are performed in a manner similar to FIG. 4.

Figure 8:
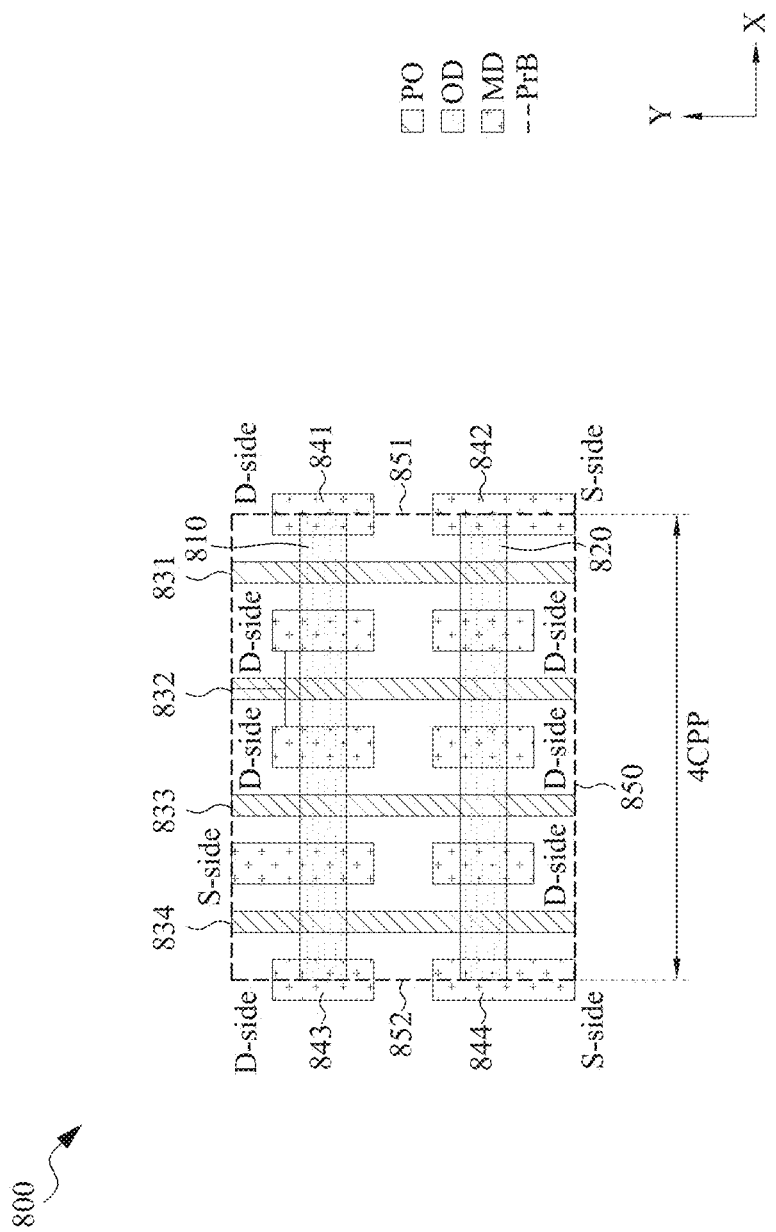
FIG. 8 is a layout diagram of a cell, in accordance with some embodiments.

FIG. 8 is a layout diagram of a cell 800, in accordance with some embodiments. The cell 800 is an AND-OR-Invert (AOI) logic, e.g., AOI22D1 (AOI with two 2-input AND gates and a driving strength of 1). This is another example of cells within the scope of various embodiments. Components in FIG. 8 having corresponding components in FIG. 1B are designated by the reference numerals of FIG. 1B increased by 700. In particular, the cell 800 comprises a first active region 810, a second active region 820, gate regions 831-834 corresponding to the gate region 130, and conductive regions 841, 842, 843, 844, on a boundary 850 along edges 851, 852. The conductive regions 841, 843 are drain side MD regions, and the conductive regions 842, 844 are source side MD regions. The cell 800 further comprises various MD regions (not numbered) between the gate regions 831-834, and crossing the first active region 810, and second active region 820. In at least one embodiment, the layout diagram of the cell 800, as well as the layout diagrams of other cells in accordance with various embodiments, are stored in a standard cell library on a non-transitory computer-readable medium.

Figure 9:
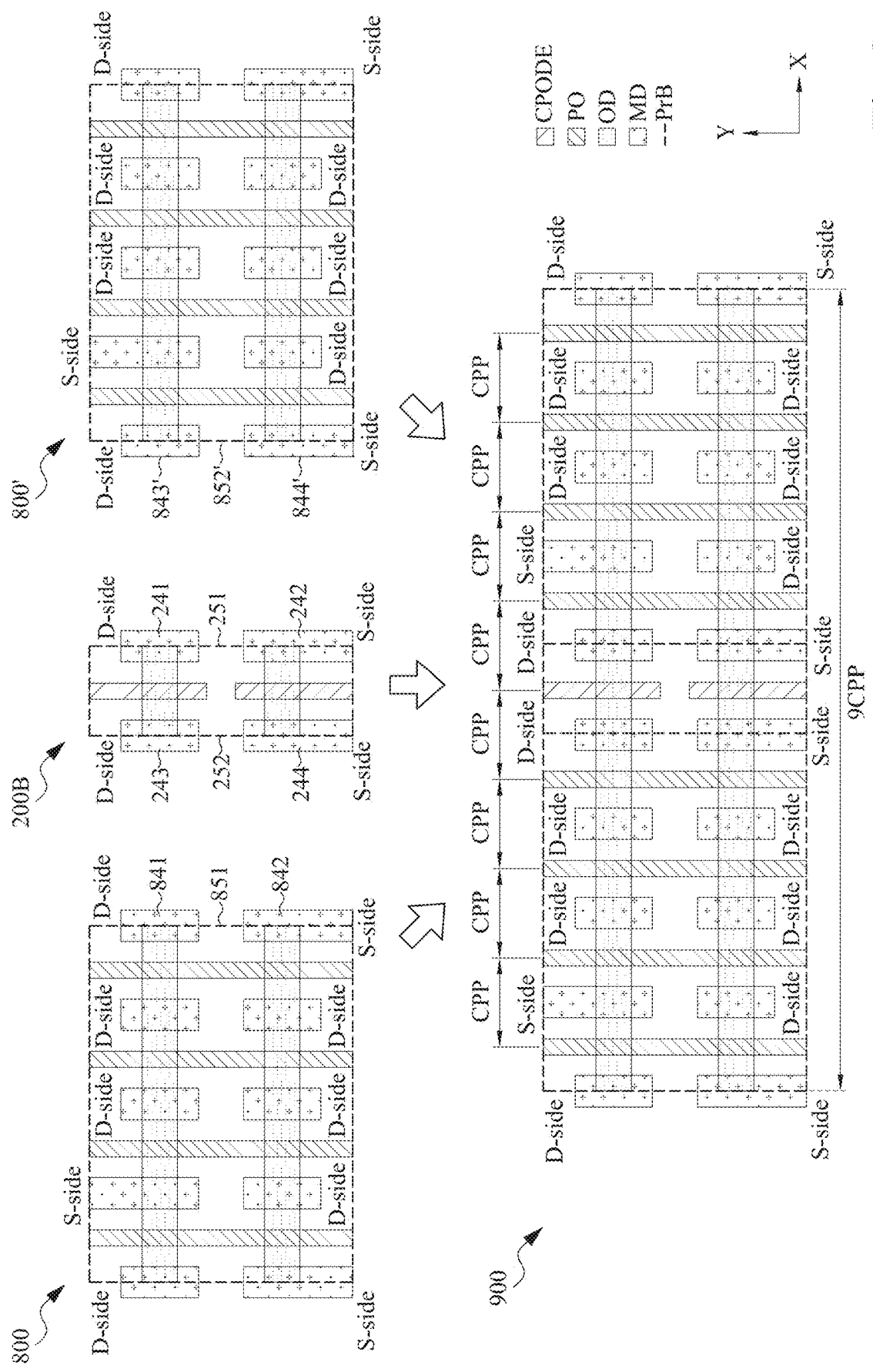
FIG. 9 includes an IC layout diagram of an IC device, and layout diagrams of various cells constituting the IC layout diagram of the IC device, in accordance with some embodiments.

FIG. 9 includes an IC layout diagram of an IC device 900, and layout diagrams of various cells constituting the IC layout diagram of the IC device 900, in accordance with some embodiments. The IC layout diagram of the IC device 900 is generated by placing a filler cell between and in abutment with two other cells, e.g., in a place-and-route operation. For example, a filler cell 200B is inserted between and placed in abutment with a cell 800 and a cell 800'. The cell 800' has the same layout diagram as the cell 800. Components in the cell 800' having corresponding components in the cell 800 are designated by the reference numerals of the cell 800 but with the prime symbol.

The cell 800 and cell 800' are not placed in a direct abutment with each other, because at least one of the MD regions (i.e., 841, 843') along the opposing edges 851, 852' is a drain side MD region, and insertion of a filler cell between the cell 800 and cell 800' is performed. In some embodiments, the filler cell 200B to be inserted between the cell 800 and cell 800' in FIG. 9 is selected in a manner similar to FIG. 4. The abutment between the filler cell 200B and the cell 800, and the abutment between the filler cell 200B and the cell 800' in FIG. 9 are performed in a manner similar to FIG. 4.

The cell 100, cell 100', cell 500, cell 500', cell 800 are non-exhaustive examples of non-filler cells within the scope of various embodiments. The filler cells 200A-200E are non-exhaustive examples of filler cells within the scope of various embodiments. Together, the cell 100, cell 100', cell 500, cell 500', cell 800 and filler cells 200A-200E are non-exhaustive examples of cells within the scope of various embodiments. In at least one embodiment, a plurality of such cells are stored in a standard cell library on a non-transitory computer-readable medium. The cells in the standard cell library are then placed in abutment to generate IC layout diagrams for various ICs. The abutments of cells as described with respect to FIGS. 3, 4, 6, 7, 9 are non-exhaustive examples of combinations of cells in various embodiment. In at least one embodiment, a cell is not necessarily placed side by side with another cell with the same functionality, e.g., an inverter placed next to another inverter as described with respect to FIGS. 3-4, or a NAND gate placed next to another NAND gate as described with respect to FIGS. 6-7. Rather, in at least one embodiment, it is possible to place a cell in direct abutment, or with an inserted filler cell, with another cell having a different functionality. As a result, various IC layout diagrams are achievable with one or more advantages as described herein.

In some embodiments, by arranging MD regions of a cell on opposite edges of a boundary of the cell, it is possible to reduce a width of the cell. For example, the width of an inverter cell, such as an INVD1 cell in FIG. 1B, is one CPP in at least one embodiment. For comparison, in other approaches where dummy gate regions are arranged on opposite edges of a boundary of a cell, an INVD1 cell has a greater width of 2 CPP. When two INVD1 cells in accordance with some embodiments are placed side by side, the INVD1 cells are placed in direct abutment as described with respect to FIG. 3, or with an inserted filler cell in between as described with respect to FIG. 4. The resulting abutted INVD1 cells have a combined width of 2 CPP (FIG. 3) or 3 CPP (FIG. 4). In either case, such a combined width in at least one embodiment is less than in the other approaches where two INVD1 cells placed in abutment have a greater, combined width of 4 CPP. Similar reductions in cell width are achievable with other cells in accordance with various embodiments. For example, an ND2D1 cell in FIG. 5 has a cell width of 2 CPP, whereas an ND2D1 cell in the other approaches has a greater width of 3 CPP. In another example, an AOI22D1 cell in FIG. 8 has a cell width of 4 CPP, whereas an AOI22D1 cell in the other approaches has a greater width of 5 CPP. Even when a filler cell, e.g., any one of filler cells 200A-200E, is inserted to abut two other cells in accordance with some embodiments, due to the small width, e.g., one CPP, of the filler cell, the combined width of the abutted cells in at least one embodiment is still smaller than the combined width of abutted cells having similar functionality in the other approaches. At reduced cell widths of various cells in accordance with some embodiments, it is possible to include more cells and/or functionality in the same amount of chip area, advantageously resulting in an increased gate density in at least one embodiment. In one or more embodiments, the increase or gain of the gate density of about 10% is achievable.

Figure 10A:
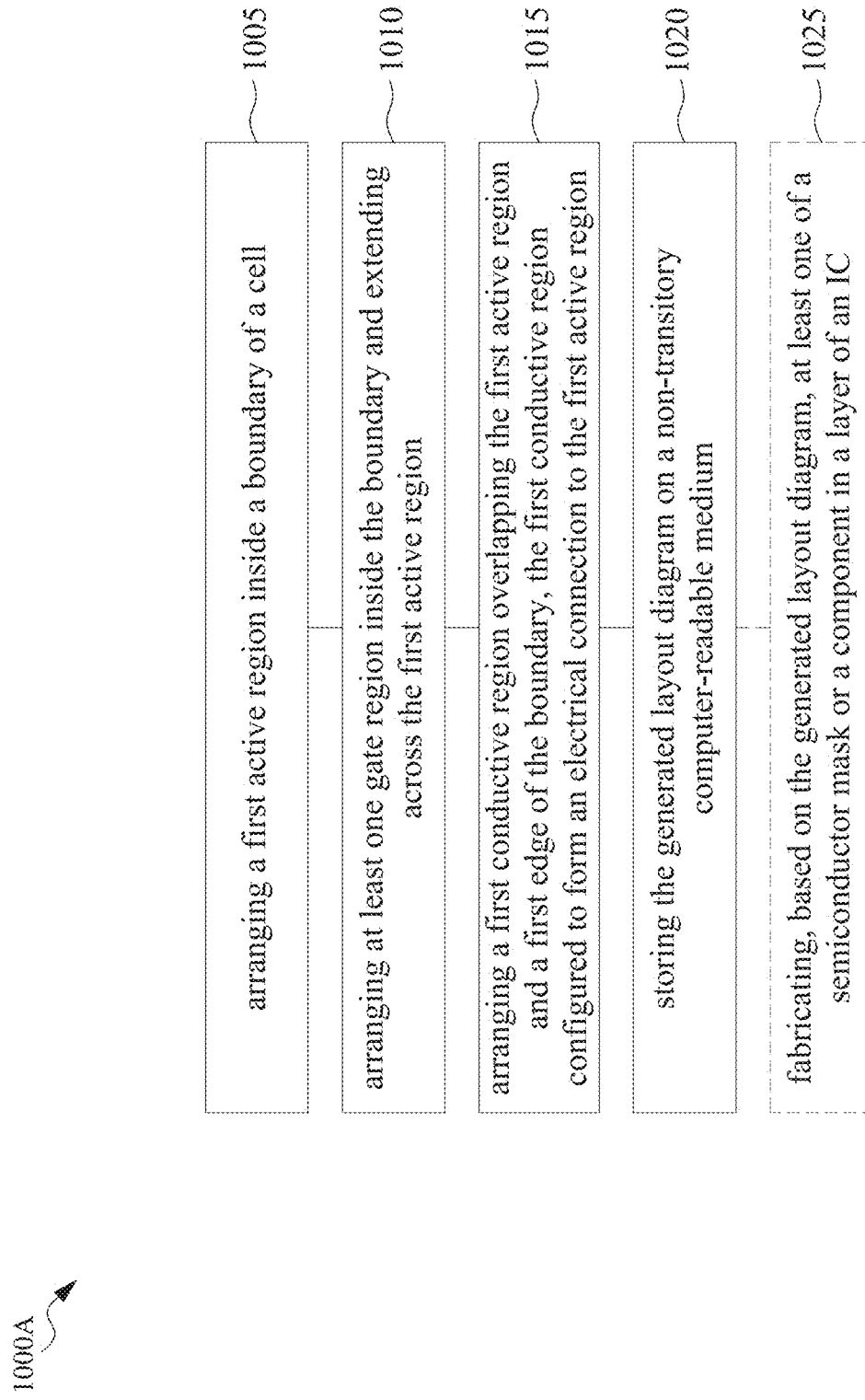
FIG. 10A is a flow chart of a method, in accordance with some embodiments.

FIG. 10A is a flow chart of a method 1000A, in accordance with some embodiments. In at least one embodiment, the method 1000A is for generating a layout diagram for a cell and/or for building a standard cell library including various cells.

In some embodiments, one or more operations of the method 1000A are performed as part of a method of forming one or more IC devices corresponding to the IC devices 300, 400, 600, 700, 900 described herein. In some embodiments, one or more operations of the method 1000A are performed as part of an automated placement and routing (APR) method. In some embodiments, one or more operations of the method 1000A are performed by an APR system, e.g., a system included in an EDA system described with respect to FIG. 16. In some embodiments, one or more operations of the method 1000A are performed as part of a method 1000B described with respect to FIG. 10B, for generating a layout diagram of an IC. In some embodiments, one or more operations of the method 1000A are performed as part of a design procedure performed in a design house described with respect to FIG. 17. In some embodiments, one or more operations of the method 1000A are executed by a processor, such as a processor of an EDA system described with respect to FIG. 16.

At operation 1005, a first active region is arranged inside a boundary of a cell. For example, an active region 110 or 120 is arranged inside a boundary 150 of a cell 100, as described with respect to FIG. 1B. For another example, an active region 210 or 220 is arranged inside a boundary 250 of any of filler cells 200A-200E, as described with respect to FIG. 2. Further examples are described with respect to FIGS. 5 and 8.

At operation 1010, at least one gate region is arranged inside the boundary and extending across the first active region. For example, at least one gate region 130 is arranged inside the boundary 150 and extending across the active region 110 or 120, as described with respect to FIG. 1B. For another example, at least one gate region 230 is arranged inside the boundary 250 and extending across the active region 210 or 220, as described with respect to any of filler cells 200A-200E in FIG. 2. Further examples are described with respect to FIGS. 5 and 8.

At operation 1015, a first conductive region is arranged to overlap the first active region and a first edge of the boundary, and the first conductive region is configured to make electrical contact with the first active region. For example, an MD region 141, 142, 143 or 144 is arranged to overlap the active region 110 or 120 and an edge 151 or 152 of the boundary 150, and the MD region 141, 142, 143 or 144 is configured to form an electrical connection to the active region 110 or 120. For another example, an MD region 241, 242, 243 or 244 is arranged to overlap the active region 210 or 220 and an edge 251 or 252 of the boundary 250, and the MD region 241, 242, 243 or 244 is configured to form an electrical connection to the active region 210 or 220, as described with respect to any of filler cells 200A-200E in FIG. 2. Further examples are described with respect to FIGS. 5 and 8.

At operation 1020, the generated layout diagram is stored on a non-transitory computer-readable medium. For example, one or more layout diagrams for one or more cells described with respect to FIGS. 1B, 2, 5, 8 is/are stored in a standard cell library on a non-transitory computer-readable medium.

Figure 17:
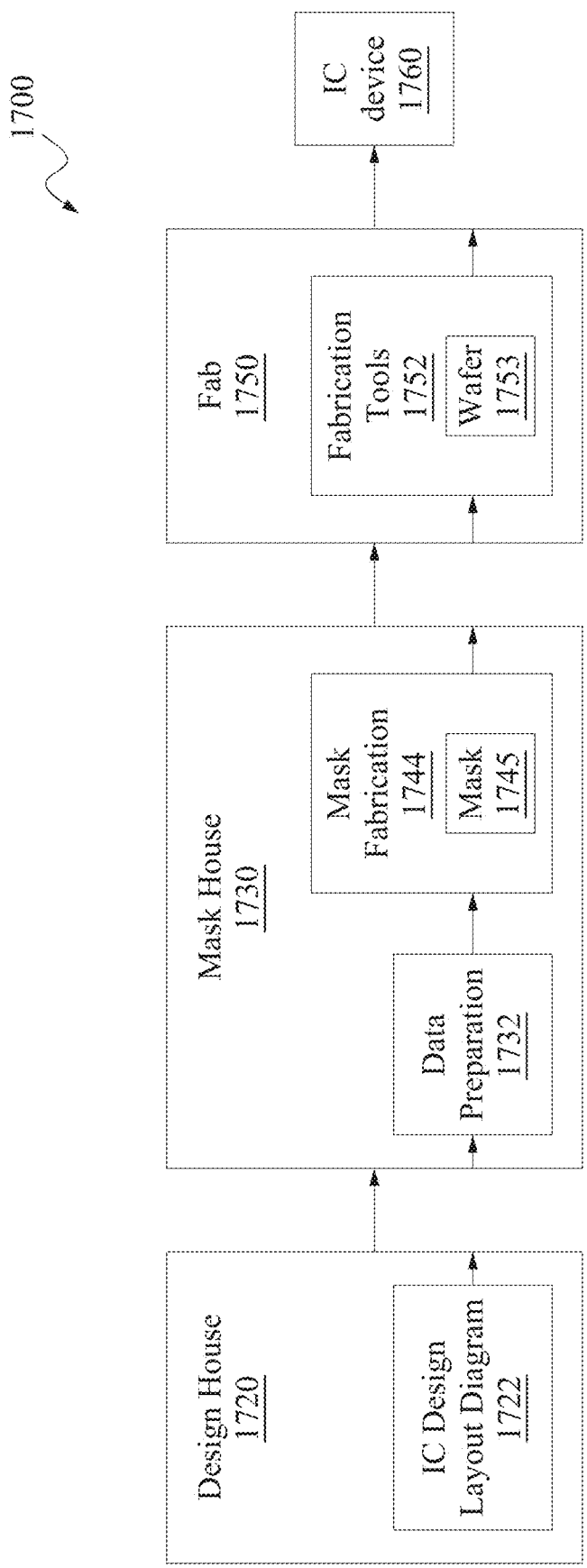
FIG. 17 is a block diagram of an IC manufacturing system and an IC manufacturing flow associated therewith, in accordance with some embodiments.

At operation 1025, based on the generated layout diagram, at least one of a semiconductor mask or a component in a layer of an IC is fabricated, for example, as described with respect to FIG. 17. In at least one embodiment, operation 1025 is omitted.

FIG. 10B is a flow chart of a method 1000B, in accordance with some embodiments. In at least one embodiment, the method 1000B is for generating an IC layout diagram of an IC device, based on cells received from a standard cell library.

In some embodiments, one or more operations of the method 1000B are performed as part of forming one or more IC devices corresponding to the IC devices 300, 400, 600, 700, 900 described herein. In some embodiments, one or more operations of the method 1000B are performed as part of an APR method. In some embodiments, one or more operations of the method 1000B are performed by an APR system, e.g., a system included in an EDA system described with respect to FIG. 16, and configured to perform the APR method. In some embodiments, one or more operations of the method 1000B are performed as part of a design procedure performed in a design house described with respect to FIG. 17. In some embodiments, one or more operations of the method 1000B are executed by a processor, such as a processor of an EDA system described with respect to FIG. 16.

At operation 1030, a first cell is placed in abutment with a second cell in an IC layout diagram, so that a boundary of the first cell abuts a boundary of the second cell along a first common edge, and a first conductive region (MD) of the first cell is merged with a second conductive region (MD) of the second cell into a first common conductive region overlapping the first common edge.

For example, as described with respect to FIG. 3, a first cell 100 is placed in abutment with a second cell 100' in an IC layout diagram of an IC device 300, so that a boundary 150 of the first cell 100 abuts a boundary 150' of the second cell 100' along a first common edge 352, and a first MD region 143 or 144 of the first cell 100 is merged with a second MD region 143' or 144' of the second cell 100' into a first common MD region 343 or 344 overlapping the first common edge 352.

For another example, as described with respect to FIG. 4, a first cell 100 is placed in abutment with a second cell 200A in an IC layout diagram of an IC device 400, so that a boundary 150 of the first cell 100 abuts a boundary 250 of the second cell 200A along a first common edge 452, and a first MD region 141 or 142 of the first cell 100 is merged with a second MD region 243 or 244 of the second cell 200A into a first common MD region 443 or 444 overlapping the first common edge 452. Further examples are described with respect to FIGS. 6, 7 and 9.

At operation 1035, a third cell is placed in abutment with the second cell in the IC layout diagram, so that a boundary of the third cell abuts the boundary of the second cell along a second common edge, and a third conductive region (MD) of the third cell is merged with a fourth conductive region (MD) of the second cell into a second common conductive region overlapping the second common edge.

For example, as described with respect to FIG. 4, a third cell 100' is placed in abutment with the second cell 200A in the IC layout diagram of the IC device 400, so that a boundary 150' of the third cell 100' abuts the boundary 250 of the second cell 200A along a second common edge 451, and a third MD region 141' or 142' of the third cell 100' is merged with a fourth MD region 241 or 242 of the second cell 200A into a second common MD region 441 or 442 overlapping the second common edge 451. Further examples are described with respect to FIGS. 7 and 9. In at least one embodiment, operation 1035 is omitted.

At operation 1040, the generated IC layout diagram is stored on a non-transitory computer-readable medium. For example, one or more IC layout diagrams for one or more IC devices described with respect to FIGS. 3, 4, 6, 7, 9 is/are stored on a non-transitory computer-readable medium.

At operation 1045, based on the generated IC layout diagram, at least one of a semiconductor mask or a component in a layer of an IC is fabricated, for example, as described with respect to FIG. 17. In at least one embodiment, operation 1045 is omitted.

In some embodiments, one or more cells, IC devices, and methods described are applicable to various types of transistor or device technologies including, but not limited to, planar transistor technology, FINFET technology, nanosheet FET technology, nanowire FET technology, or the like.

FIG. 11A is a schematic top plan view of a planar transistor 1100, FIG. 11B is a schematic cross-section view of the planar transistor 1100 along line X1-X1 in FIG. 11A, and FIG. 11C is a schematic cross-section view of the planar transistor 1100 along line Y1-Y1 in FIG. 11A, in accordance with some embodiments.

As shown in FIG. 11A, the planar transistor 1100 comprises active regions or source/drain regions 1110, 1120, and a gate region 1130 extending in the Y direction across the source/drain regions 1110, 1120. As shown in FIG. 11B, the source/drain regions 1110, 1120 and the gate region 1130 are formed over a substrate 1140. As shown in FIG. 11C, a channel region 1150 is formed under the gate region 1130 and between the source/drain regions 1110, 1120.

FIG. 12A is a schematic top plan view of a FINFET 1200, FIG. 12B is a schematic cross-section view of the FINFET 1200 along line X2-X2 in FIG. 12A, and FIG. 12C is a schematic cross-section view of the FINFET 1200 along line Y2-Y2 in FIG. 12A, in accordance with some embodiments.

As shown in FIG. 12A, the FINFET 1200 comprises active regions or source/drain regions 1210, 1220, and a gate region 1230 extending in the Y direction across the source/drain regions 1210, 1220. The source/drain regions 1210, 1220 include a plurality of fins 1260 (best seen in FIG. 12B) extending in the X direction. As shown in FIG. 12B, the source/drain regions 1210, 1220 and the gate region 1230 are formed over a substrate 1240, and the fins 1260 are under the gate region 1230. As shown in FIGS. 12B-12C, channel regions 1250 are formed over the fins 1260, under the gate region 1230, and between the source/drain regions 1210, 1220.

FIG. 13A is a schematic top plan view of a nanosheet FET 1300, FIG. 13B is a schematic cross-section view of the nanosheet FET 1300 along line X3-X3 in FIG. 13A, and FIG. 13C is a schematic cross-section view of the nanosheet FET 1300 along line Y3-Y3 in FIG. 13A, in accordance with some embodiments.

As shown in FIG. 13A, the nanosheet FET 1300 comprises active regions or source/drain regions 1310, 1320, and a gate region 1330 extending in the Y direction across the source/drain regions 1310, 1320. The source/drain regions 1310, 1320 include a plurality of nanosheets 1360 (best seen in FIG. 13B). As shown in FIG. 13B, the source/drain regions 1310, 1320 and the gate region 1330 are formed over a substrate 1340. The nanosheets 1360 are surrounded by the gate region 1330. As shown in FIGS. 13B-13C, channel regions 1350 are formed between the nanosheets 1360 and the gate region 1330, and between the source/drain regions 1310, 1320.

FIG. 14A is a schematic top plan view of a nanowire FET 1400, FIG. 14B is a schematic cross-section view of the nanowire FET 1400 along line X4-X4 in FIG. 14A, and FIG. 14C is a schematic cross-section view of the nanowire FET 1400 along line Y4-Y4 in FIG. 14A, in accordance with some embodiments.

As shown in FIG. 14A, the nanowire FET 1400 comprises active regions or source/drain regions 1410, 1420, and a gate region 1430 extending in the Y direction across the source/drain regions 1410, 1420. The source/drain regions 1410, 1420 include a plurality of nanowires 1460 (best seen in FIG. 14B). As shown in FIG. 14B, the source/drain regions 1410, 1420 and the gate region 1430 are formed over a substrate 1440. The nanowires 1460 are surrounded by the gate region 1430. As shown in FIGS. 14B-13C, channel regions 1450 are formed between the nanowires 1460 and the gate region 1430, and between the source/drain regions 1410, 1420.

FIGS. 15A-15G are schematic cross-sectional views of an IC device 1500 being manufactured at various stages of a manufacturing process, in accordance with some embodiments.

In FIG. 15A, the manufacturing process starts from a substrate 1510. The substrate 1510 comprises, in at least one embodiment, a silicon substrate. The substrate 1510 comprises, in at least one embodiment, silicon germanium (SiGe), Gallium arsenic, or other suitable semiconductor materials. Active regions (not shown in FIG. 15A) are formed in or over the substrate 1510, using one or more mask corresponding to one or more active regions in the layout diagrams described with respect to FIGS. 1B-9. A gate dielectric layer 1520 is deposited over the substrate 1510. Example materials of the gate dielectric layer 1520 include, but are not limited to, a high-k dielectric layer, an interfacial layer, and/or combinations thereof. In some embodiments, the gate dielectric layer 1520 is deposited over the substrate 1510 by atomic layer deposition (ALD) or other suitable techniques.

In FIG. 15B, a gate electrode layer 1530 is deposited over the gate dielectric layer 1520. Example materials of the gate electrode layer 1530 include, but are not limited to, polysilicon, metal, Al, AlTi, Ti, TiN, TaN, Ta, TaC, TaSiN, W, WN, MoN, and/or other suitable conductive materials. In some embodiments, the gate electrode layer 1530 is deposited by chemical vapor deposition (CVD), physical vapor deposition (PVD or sputtering), plating, atomic layer deposition (ALD), and/or other suitable processes.

In FIG. 15C, a photoresist layer 1540 is deposited over the gate electrode layer 1530, and a mask 1545 corresponding to one or more gate regions in the layout diagrams described with respect to FIGS. 1B-9 is used to pattern the photoresist layer 1540. The patterned photoresist layer 1540 is next used as a mask to pattern the gate dielectric layer 1520 and the gate electrode layer 1530 into various gate dielectrics 1525 and corresponding gate electrodes 1535. The patterned photoresist layer 1540 is then removed.

In FIG. 15D, a spacer layer 1550 is deposited over the substrate 1510 with the gate dielectrics 1525 and gate electrodes 1535 formed thereon. Example materials of the spacer layer 1550 include, but are not limited to, silicon nitride, oxynitride, silicon carbide and other suitable materials. In some embodiments, the spacer layer 1550 is deposited by plasma enhanced chemical vapor deposition (PECVD), low-pressure chemical vapor deposition (LPCVD), sub-atmospheric chemical vapor deposition (SACVD), atomic layer deposition (ALD), or the like.

In FIG. 15E, the spacer layer 1550 is patterned to form spacers 1555 in contact or adjacent to sidewalls of the corresponding gate electrodes 1535. The patterning is performed, in at least one embodiment, by suitable techniques, such as a wet etch process, a dry etch process, or combinations thereof. Source/drain regions 1515 are formed in the active regions of the substrate 1510 exposed by the spacers 1555. In at least one embodiment, the source/drain regions 1515 are formed by using the gate electrodes 1535 and the spacers 1555 as a mask. For example, the formation of the source/drain regions 1515 is performed by an ion implantation or a diffusion process. Depending on the type of the devices or transistors, the source/drain regions 1515 are doped with p-type dopants, such as boron or BF2, n-type dopants, such as phosphorus or arsenic, and/or combinations thereof.

Figure 15F:
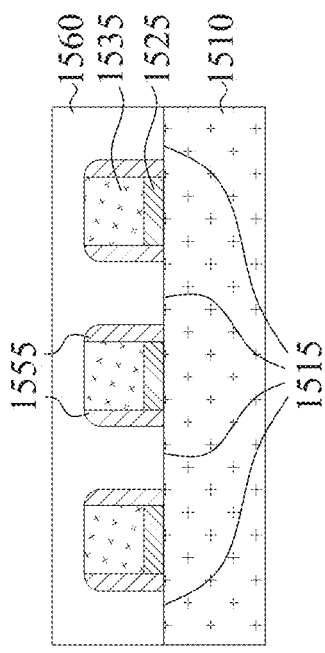

In FIG. 15F, a conductive layer 1560 is deposited over the substrate 1510, and filling in the area exposed by the by the spacers 1555, thereby making electrical connections to the source/drain regions 1515.

Figure 15G:
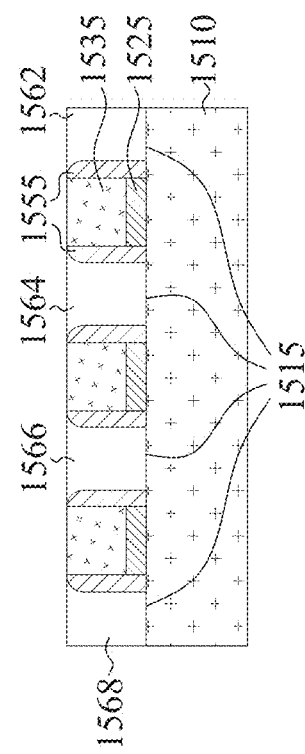

In FIG. 15G, a planarizing process is performed to planarize the conductive layer 1560, resulting in MD regions 1562, 1564, 1566, 1568 in electrical contact with the underlying source/drain regions 1515. The planarizing process comprises, for example, a chemical mechanical polish (CMP) process. In at least one embodiment, the MD regions 1562, 1564, 1566, 1568 correspond to one or more MD regions in the layout diagrams described with respect to FIGS. 1B-9. Further processing (not shown) is performed to obtain the IC device 1500. For example, in such further processing one or more dielectric layers, via layers, and metal layers are formed over the exposed planarized top surfaces of the MD regions 1562, 1564, 1566, 1568 and the gate electrodes 1535 to form interconnects to other cells of the IC device 1500 or to external circuitry.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, some or all of the methods discussed above are performed by an IC layout diagram generation system. In some embodiments, an IC layout diagram generation system is usable as part of a design house of an IC manufacturing system discussed below.

Figure 16:
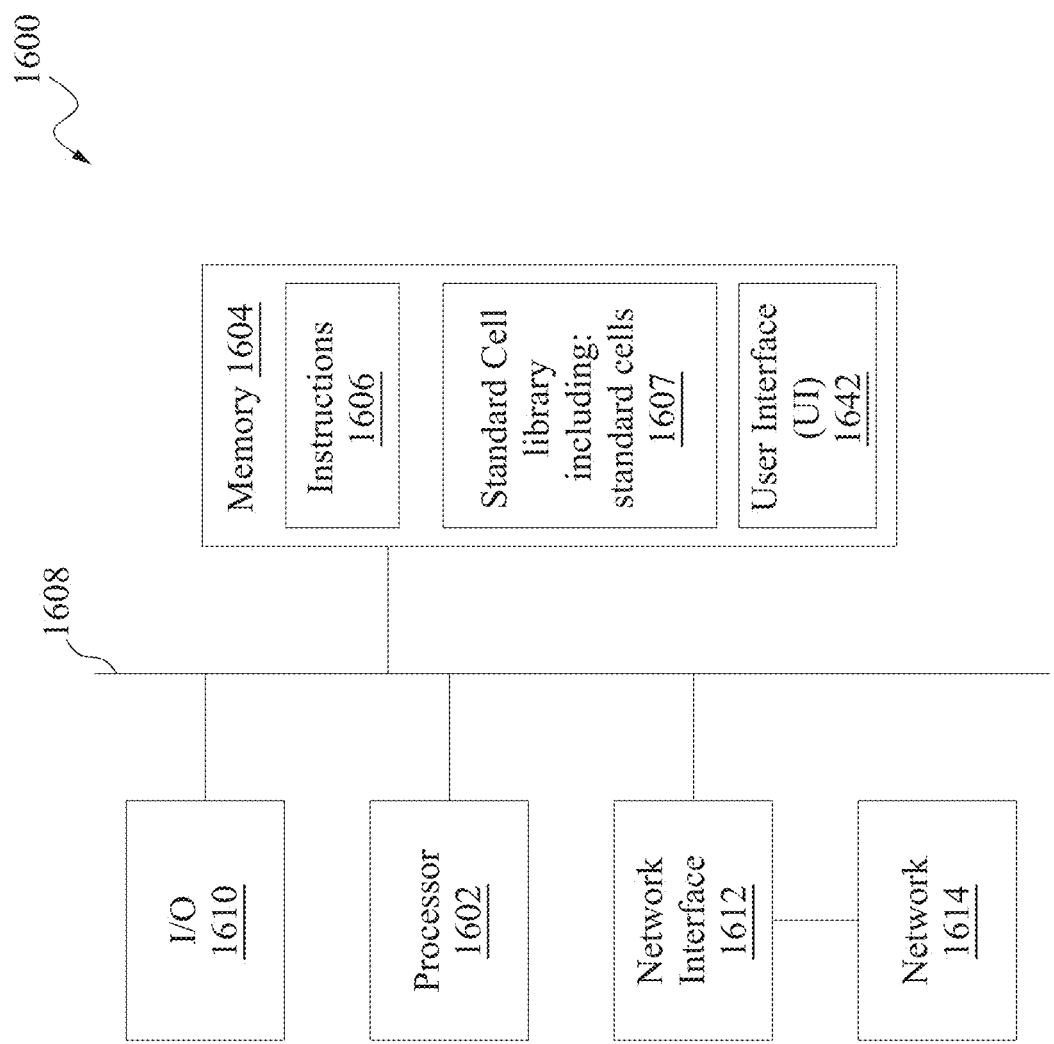
FIG. 16 is a block diagram of an EDA system, in accordance with some embodiments.

FIG. 16 is a block diagram of an electronic design automation (EDA) system 1600 in accordance with some embodiments.

In some embodiments, EDA system 1600 includes an APR system. Methods described herein of designing layout diagrams represent wire routing arrangements, in accordance with one or more embodiments, are implementable, for example, using EDA system 1600, in accordance with some embodiments.

In some embodiments, EDA system 1600 is a general purpose computing device including a hardware processor 1602 and a non-transitory, computer-readable storage medium 1604. Storage medium 1604, amongst other things, is encoded with, i.e., stores, computer program code 1606, i.e., a set of executable instructions. Execution of instructions 1606 by hardware processor 1602 represents (at least in part) an EDA tool which implements a portion or all of the methods described herein in accordance with one or more embodiments (hereinafter, the noted processes and/or methods).

Processor 1602 is electrically coupled to computer-readable storage medium 1604 via a bus 1608. Processor 1602 is also electrically coupled to an I/O interface 1610 by bus 1608. A network interface 1612 is also electrically connected to processor 1602 via bus 1608. Network interface 1612 is connected to a network 1614, so that processor 1602 and computer-readable storage medium 1604 are capable of connecting to external elements via network 1614. Processor 1602 is configured to execute computer program code 1606 encoded in computer-readable storage medium 1604 in order to cause system 1600 to be usable for performing a portion or all of the noted processes and/or methods. In one or more embodiments, processor 1602 is a central processing unit (CPU), a multi-processor, a distributed processing system, an application specific integrated circuit (ASIC), and/or a suitable processing unit.

In one or more embodiments, computer-readable storage medium 1604 is an electronic, magnetic, optical, electromagnetic, infrared, and/or a semiconductor system (or apparatus or device). For example, computer-readable storage medium 1604 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1604 includes a compact disk-read only memory (CD-ROM), a compact disk-read/write (CD-R/W), and/or a digital video disc (DVD).

In one or more embodiments, storage medium 1604 stores computer program code 1606 configured to cause system 1600 (where such execution represents (at least in part) the EDA tool) to be usable for performing a portion or all of the noted processes and/or methods. In one or more embodiments, storage medium 1604 also stores information which facilitates performing a portion or all of the noted processes and/or methods. In one or more embodiments, storage medium 1604 stores library 1607 of standard cells including such standard cells as disclosed herein.

EDA system 1600 includes I/O interface 1610. I/O interface 1610 is coupled to external circuitry. In one or more embodiments, I/O interface 1610 includes a keyboard, keypad, mouse, trackball, trackpad, touchscreen, and/or cursor direction keys for communicating information and commands to processor 1602.

EDA system 1600 also includes network interface 1612 coupled to processor 1602. Network interface 1612 allows system 1600 to communicate with network 1614, to which one or more other computer systems are connected. Network interface 1612 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1600.

System 1600 is configured to receive information through I/O interface 1610. The information received through I/O interface 1610 includes one or more of instructions, data, design rules, libraries of standard cells, and/or other parameters for processing by processor 1602. The information is transferred to processor 1602 via bus 1608. EDA system 1600 is configured to receive information related to a UI through I/O interface 1610. The information is stored in computer-readable medium 1604 as user interface (UI) 1642.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1600. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

FIG. 17 is a block diagram of an integrated circuit (IC) manufacturing system 1700, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1700.

In FIG. 17, IC manufacturing system 1700 includes entities, such as a design house 1720, a mask house 1730, and an IC manufacturer/fabricator ("fab") 1750, that interact with one another in the design, development, and manufacturing cycles and/or services related to manufacturing an IC device 1760. The entities in system 1700 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1720, mask house 1730, and IC fab 1750 is owned by a single larger company. In some embodiments, two or more of design house 1720, mask house 1730, and IC fab 1750 coexist in a common facility and use common resources.

Design house (or design team) 1720 generates an IC design layout diagram 1722. IC design layout diagram 1722 includes various geometrical patterns designed for an IC device 1760. The geometrical patterns correspond to patterns of metal, oxide, or semiconductor layers that make up the various components of IC device 1760 to be fabricated. The various layers combine to form various IC features. For example, a portion of IC design layout diagram 1722 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1720 implements a proper design procedure to form IC design layout diagram 1722. The design procedure includes one or more of logic design, physical design or place-and-route operation. IC design layout diagram 1722 is presented in one or more data files having information of the geometrical patterns. For example, IC design layout diagram 1722 can be expressed in a GDSII file format or DFII file format.

Mask house 1730 includes data preparation 1732 and mask fabrication 1744. Mask house 1730 uses IC design layout diagram 1722 to manufacture one or more masks 1745 to be used for fabricating the various layers of IC device 1760 according to IC design layout diagram 1722. Mask house 1730 performs mask data preparation 1732, where IC design layout diagram 1722 is translated into a representative data file ("RDF"). Mask data preparation 1732 provides the RDF to mask fabrication 1744. Mask fabrication 1744 includes a mask writer. A mask writer converts the RDF to an image on a substrate, such as a mask (reticle) 1745 or a semiconductor wafer 1753. The design layout diagram 1722 is manipulated by mask data preparation 1732 to comply with particular characteristics of the mask writer and/or requirements of IC fab 1750. In FIG. 17, mask data preparation 1732 and mask fabrication 1744 are illustrated as separate elements. In some embodiments, mask data preparation 1732 and mask fabrication 1744 can be collectively referred to as mask data preparation.

In some embodiments, mask data preparation 1732 includes optical proximity correction (OPC) which uses lithography enhancement techniques to compensate for image errors, such as those that can arise from diffraction, interference, other process effects and the like. OPC adjusts IC design layout diagram 1722. In some embodiments, mask data preparation 1732 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1732 includes a mask rule checker (MRC) that checks the IC design layout diagram 1722 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1722 to compensate for limitations during mask fabrication 1744, which may undo part of the modifications performed by OPC in order to meet mask creation rules.

In some embodiments, mask data preparation 1732 includes lithography process checking (LPC) that simulates processing that will be implemented by IC fab 1750 to fabricate IC device 1760. LPC simulates this processing based on IC design layout diagram 1722 to create a simulated manufactured device, such as IC device 1760. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1722.

It should be understood that the above description of mask data preparation 1732 has been simplified for the purposes of clarity. In some embodiments, data preparation 1732 includes additional features such as a logic operation (LOP) to modify the IC design layout diagram 1722 according to manufacturing rules. Additionally, the processes applied to IC design layout diagram 1722 during data preparation 1732 may be executed in a variety of different orders.

After mask data preparation 1732 and during mask fabrication 1744, a mask 1745 or a group of masks 1745 are fabricated based on the modified IC design layout diagram 1722. In some embodiments, mask fabrication 1744 includes performing one or more lithographic exposures based on IC design layout diagram 1722. In some embodiments, an electron-beam (e-beam) or a mechanism of multiple e-beams is used to form a pattern on a mask (photomask or reticle) 1745 based on the modified IC design layout diagram 1722. Mask 1745 can be formed in various technologies. In some embodiments, mask 1745 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1745 includes a transparent substrate (e.g., fused quartz) and an opaque material (e.g., chromium) coated in the opaque regions of the binary mask. In another example, mask 1745 is formed using a phase shift technology. In a phase shift mask (PSM) version of mask 1745, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1744 is used in a variety of processes. For example, such a mask(s) is used in an ion implantation process to form various doped regions in semiconductor wafer 1753, in an etching process to form various etching regions in semiconductor wafer 1753, and/or in other suitable processes.

IC fab 1750 is an IC fabrication business that includes one or more manufacturing facilities for the fabrication of a variety of different IC products. In some embodiments, IC Fab 1750 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1750 includes fabrication tools 1752 configured to execute various manufacturing operations on semiconductor wafer 1753 such that IC device 1760 is fabricated in accordance with the mask(s), e.g., mask 1745. In various embodiments, fabrication tools 1752 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1750 uses mask(s) 1745 fabricated by mask house 1730 to fabricate IC device 1760. Thus, IC fab 1750 at least indirectly uses IC design layout diagram 1722 to fabricate IC device 1760. In some embodiments, semiconductor wafer 1753 is fabricated by IC fab 1750 using mask(s) 1745 to form IC device 1760. In some embodiments, the IC fabrication includes performing one or more lithographic exposures based at least indirectly on IC design layout diagram 1722. Semiconductor wafer 1753 includes a silicon substrate or other proper substrate having material layers formed thereon. Semiconductor wafer 1753 further includes one or more of various doped regions, dielectric features, multi-level interconnects, and the like (formed at subsequent manufacturing steps).

Details regarding an integrated circuit (IC) manufacturing system (e.g., system 1700 of FIG. 17), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a method comprises generating a layout diagram of a cell of an integrated circuit (IC), and storing the generated layout diagram on a non-transitory computer-readable medium. In the generating the layout diagram of the cell, a first active region is arranged inside a boundary of the cell. The first active region extends along a first direction. At least one gate region is arranged inside the boundary. The at least one gate region extends across the first active region along a second direction transverse to the first direction. A first conductive region is arranged to overlap the first active region and a first edge of the boundary. The first conductive region is configured to form an electrical connection to the first active region.

In some embodiments, a method comprises generating an integrated circuit (IC) layout diagram, and storing the generated IC layout diagram on a non-transitory computer-readable medium. The generating the IC layout diagram comprises placing a first cell in abutment with a second cell in the IC layout diagram. A boundary of the first cell abuts a boundary of the second cell along a first common edge. A first conductive region of the first cell, which overlaps and is configured to form an electrical connection to a first active region of the first cell, is merged with a second conductive region of the second cell, which overlaps and is configured to form an electrical connection to a second active region of the second cell, into a first common conductive region overlapping the first common edge.

In some embodiments, an integrated circuit (IC) device comprises a first cell, a second cell, and a first common conductive region. The first cell comprises a first boundary, a first active region inside the first boundary and extending along a first direction, and a first gate region inside the first boundary and extending across the first active region along a second direction, the second direction transverse to the first direction. The second cell comprises a second boundary abutting the first boundary along a first common edge, a second active region inside the second boundary and extending along the first direction, and a second gate region inside the second boundary and extending across the second active region along the second direction. The first common conductive region overlaps the first common edge, and is electrically coupled to both the first active region and the second active region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
generating a layout diagram of a cell of an integrated circuit (IC), said generating the layout diagram of the cell comprising:
arranging a first active region inside a boundary of the cell, the first active region extending along a first direction,
arranging at least one gate region inside the boundary, the at least one gate region extending across the first active region along a second direction, the second direction transverse to the first direction, and
arranging a first conductive region overlapping the first active region and a first edge of the boundary, the first conductive region configured to form an electrical connection to the first active region; and
storing the generated layout diagram on a non-transitory computer-readable medium,
wherein a width of the cell in the first direction is equal to one gate region pitch between adjacent gate regions of the IC.

2. The method of claim 1, wherein
said generating the layout diagram of the cell further comprises:
arranging a second conductive region overlapping the first active region and a second edge of the boundary, the second conductive region configured to form an electrical connection to the first active region, the second edge opposite the first edge in the first direction.

3. The method of claim 2, wherein
the first edge of the boundary coincides with a center line of the first conductive region in the first direction, and
the second edge of the boundary coincides with a center line of the second conductive region in the first direction.

4. The method of claim 2, wherein
said generating the layout diagram of the cell further comprises:
arranging a second active region inside the boundary, the second active region extending along the first direction and spaced from the first active region in the second direction, the at least one gate region extending across the second active region,
arranging a third conductive region overlapping the second active region and the first edge of the boundary, the third conductive region configured to form an electrical connection to the second active region, and
arranging a fourth conductive region overlapping the second active region and the second edge of the boundary, the fourth conductive region configured to form an electrical connection to the second active region.

5. The method of claim 1, wherein
the cell is a filler cell, and
the at least one gate region is a dummy gate region.

6. The method of claim 1, further comprising:
fabricating, based on the layout diagram, at least one of a semiconductor mask or a component in a layer of the IC.

7. A method, comprising:
generating an integrated circuit (IC) layout diagram, said generating the IC layout diagram comprising placing a first cell in abutment with a second cell in the IC layout diagram, wherein
a boundary of the first cell abuts a boundary of the second cell along a first common edge, and
a first conductive region of the first cell, which overlaps and is configured to form an electrical connection to a first active region of the first cell, is merged with a second conductive region of the second cell, which overlaps and is configured to form an electrical connection to a second active region of the second cell, into a first common conductive region overlapping the first common edge; and
storing the generated IC layout diagram on a non-transitory computer-readable medium,
wherein
said generating the IC layout diagram further comprises placing a third cell in abutment with the second cell in the IC layout diagram, wherein
a boundary of the third cell abuts the boundary of the second cell along a second common edge, the first common edge and the second common edge opposite each other in a first direction and extending along a second direction transverse to the first direction, and
a third conductive region of the third cell, which overlaps and is configured to form an electrical connection to a third active region of the third cell, is merged with a fourth conductive region of the second cell, which overlaps and is configured to form an electrical connection to the second active region of the second cell, into a second common conductive region overlapping the second common edge.

8. The method of claim 7, wherein
the second cell is a filler cell comprising a dummy gate region extending across the second active region along the second direction, the dummy gate region positioned between the first common edge and the second common edge in the first direction.

9. The method of claim 8, wherein
the first conductive region and third conductive region are drain side conductive regions configured to correspondingly form electrical connections to drain regions in the first active region and third active region.

10. The method of claim 8, wherein
each of the first cell and the third cell is a non-filler cell.

11. The method of claim 7, wherein
the first active region the second active region and the third active region are correspondingly a first p-channel metal-oxide semiconductor (PMOS) active region a second PMOS active region and a third PMOS active region, the first conductive region, the second conductive region, the third conductive region and the first common conductive region are correspondingly a first PMOS conductive region, a second PMOS conductive region, a third PMOS conductive region and a first common PMOS conductive region, the first cell further comprises:
- a first n-channel metal-oxide semiconductor (NMOS) active region, and
- a first NMOS conductive region which overlaps and is configured to form an electrical connection to the first NMOS active region, the second cell further comprises:
- a second NMOS active region, and
- a second NMOS conductive region which overlaps and is configured to form an electrical connection to the second NMOS active region, and in said placing the first cell in abutment with the second cell in the IC layout diagram,
the first NMOS conductive region is merged with the second NMOS conductive region into a first common NMOS conductive region overlapping the first common edge.

12. The method of claim 11, wherein
the third cell comprises:
- a third NMOS active region, and
- a third NMOS conductive region which overlaps and is configured to form an electrical connection to the third NMOS active region, the second cell further comprises:
- a fourth PMOS conductive region which overlaps and is configured to form an electrical connection to the second PMOS active region, and
- a fourth NMOS conductive region which overlaps and is configured to form an electrical connection to the second NMOS active region, and in said placing the third cell in abutment with the second cell in the IC layout diagram,
the third PMOS conductive region is merged with the fourth PMOS conductive region into a second common PMOS conductive region overlapping the second common edge, and
the third NMOS conductive region is merged with the fourth NMOS conductive region into a second common NMOS conductive region overlapping the second common edge.

13. The method of claim 12, wherein
the second cell is a filler cell comprising a dummy gate region extending across the second PMOS active region and the second NMOS active region along the second direction, the dummy gate region positioned between the first common edge and the second common edge in the first direction.

14. The method of claim 13, wherein
a width of the filler cell in the first direction is equal to one gate region pitch between adjacent gate regions of the IC.

15. The method of claim 13, wherein
at least one of the first PMOS conductive region, first NMOS conductive region, third PMOS conductive region or third NMOS conductive region is a drain side conductive region configured to form an electrical connection to a drain region in the corresponding first PMOS active region, first NMOS active region, third PMOS active region or third NMOS active region.

16. The method of claim 7, further comprising:
fabricating, based on the IC layout diagram, at least one of a semiconductor mask or a component in a layer of the IC.

17. The method of claim 7, wherein
a width of the second cell in the first direction is equal to one gate region pitch between adjacent gate regions of the IC.

18. An integrated circuit (IC) device, comprising:
a first cell, comprising:
- a first boundary,
- a first active region inside the first boundary and extending along a first direction, and
- a first gate region inside the first boundary and extending across the first active region along a second direction, the second direction transverse to the first direction;

a second cell, comprising:
- a second boundary abutting the first boundary along a first common edge,
- a second active region inside the second boundary and extending along the first direction, and
- a second gate region inside the second boundary and extending across the second active region along the second direction;

a first common conductive region overlapping the first common edge, and electrically coupled to both the first active region and the second active region;

a third cell, comprising:
- a third boundary abutting the second boundary along a second common edge,
- a third active region inside the third boundary and extending along the first direction, and
- a third gate region inside the third boundary and extending across the third active region along the second direction; and a second common conductive region overlapping the second common edge, and electrically coupled to both the third active region and the second active region.

19. The IC device of claim 18, wherein
the second cell is a filler cell, and
the second gate region is a dummy gate region.

20. The IC device of claim 18, wherein
a width of the second cell in the first direction is equal to one gate region pitch between adjacent gate regions of the IC.

* * * * *